(12) United States Patent
Hong

(10) Patent No.: US 6,652,717 B1
(45) Date of Patent: Nov. 25, 2003

(54) USE OF VARIABLE IMPEDANCE TO CONTROL COIL SPUTTER DISTRIBUTION

(75) Inventor: Liubo Hong, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 08/857,720

(22) Filed: May 16, 1997

(51) Int. Cl.$^7$ .................................................. C23C 14/34

(52) U.S. Cl. ........................ 204/192.25; 209/192.12; 209/298.06; 209/298.08; 118/723 I

(58) Field of Search ........................ 209/298.08, 298.06, 209/192.12, 192.25; 118/723 I

(56) References Cited

U.S. PATENT DOCUMENTS

| | | | |
|---|---|---|---|
| 3,475,702 A | 10/1969 | Ainsworth | |
| 3,569,777 A | 3/1971 | Beaudry | |
| 3,675,093 A | * 7/1972 | Russo et al. ............ | 317/249 R |
| 3,872,278 A | 3/1975 | Boom | |
| 4,229,826 A | 10/1980 | Wanzer | |
| 4,272,743 A | 6/1981 | Evans | |
| 4,284,490 A | * 8/1981 | Weber ......................... | 204/298 |
| 4,336,118 A | 6/1982 | Patten et al. | |
| 4,362,632 A | 12/1982 | Jacob | |
| 4,441,092 A | * 4/1984 | Thornton et al. ........... | 336/130 |
| 4,626,312 A | 12/1986 | Tracy | |
| 4,661,228 A | 4/1987 | Mintz | |
| 4,712,112 A | 12/1987 | Carr | |
| 4,716,491 A | 12/1987 | Ohno et al. | |
| 4,792,732 A | 12/1988 | O'Loughlin | |
| 4,842,703 A | 6/1989 | Class et al. | |
| 4,844,775 A | 7/1989 | Keeble | |
| 4,865,712 A | 9/1989 | Mintz | |
| 4,871,421 A | 10/1989 | Ogle et al. | |
| 4,918,031 A | 4/1990 | Flamm et al. | |
| 4,925,542 A | 5/1990 | Kidd | |
| 4,941,915 A | 7/1990 | Matsuoka et al. | |
| 4,948,458 A | 8/1990 | Ogle | |

(List continued on next page.)

FOREIGN PATENT DOCUMENTS

| | | |
|---|---|---|
| EP | 0520519 | 12/1992 |
| EP | 0607797 | 1/1994 |
| EP | 0714106 | 5/1996 |
| EP | 0878826 | 11/1998 |
| GB | 2162365 | 1/1986 |
| GB | 2231197 | 11/1990 |
| JP | 59-190363 | 10/1984 |
| JP | 61-190070 | 8/1986 |
| JP | 6232055 | 8/1994 |
| JP | 6283470 | 10/1994 |
| JP | 7176398 | 7/1995 |
| JP | 7176399 | 7/1995 |
| JP | 8153712 | 6/1996 |
| JP | 8288259 | 11/1996 |
| WO | WO8606923 | 11/1986 |
| WO | WO972474 | 7/1997 |
| WO | WO997913 | 2/1999 |

OTHER PUBLICATIONS

EPO Search Report issued Jul. 22, 1999 in 98303794.6 (Counterpart of U.S. Serial No. 08/857,720).

Sansonnens, L., et al., A voltagae uniformity study in large–area reactors for RF plasma deposition, Plasma Sources Sci. Technol. 6 (1977) 170–178 (no month).

(List continued on next page.)

*Primary Examiner*—Carol Chaney
*Assistant Examiner*—Julian A. Mercado
(74) *Attorney, Agent, or Firm*—Konrad Raynes Victor & Mann

(57) ABSTRACT

Variable reactances in an impedance-matching box for an RF coil, in a plasma deposition system for depositing a film of sputtered target material on a substrate, can be varied during the deposition process so that the RF coil and substrate heating, and the film deposition, are more uniform due to "time-averaging" of the RF voltage distributions along the RF coil.

92 Claims, 10 Drawing Sheets

U.S. PATENT DOCUMENTS

| | | | |
|---|---|---|---|
| 4,990,229 A | | 2/1991 | Campbell et al. |
| 4,999,096 A | | 3/1991 | Nihei et al. |
| 5,065,698 A | | 11/1991 | Koike |
| 5,091,049 A | | 2/1992 | Campbell et al. |
| 5,122,251 A | | 6/1992 | Campbell et al. |
| 5,135,629 A | | 8/1992 | Sawada et al. |
| 5,146,137 A | | 9/1992 | Gesche et al. |
| 5,175,608 A | | 12/1992 | Nihei et al. |
| 5,178,739 A | | 1/1993 | Barnes et al. |
| 5,195,045 A | * | 3/1993 | Keane et al. ............... 364/482 |
| 5,206,516 A | | 4/1993 | Keller et al. |
| 5,225,740 A | | 7/1993 | Ohkawa |
| 5,231,334 A | | 7/1993 | Paranjpe |
| 5,234,560 A | | 8/1993 | Kadlec et al. |
| 5,241,245 A | | 8/1993 | Barnes et al. |
| 5,280,154 A | | 1/1994 | Cuomo et al. |
| 5,304,279 A | | 4/1994 | Coultas et al. |
| 5,312,717 A | | 5/1994 | Sachdev et al. |
| 5,346,578 A | | 9/1994 | Benzing et al. |
| 5,361,016 A | | 11/1994 | Ohkawa et al. |
| 5,366,590 A | | 11/1994 | Kadomura |
| 5,368,685 A | | 11/1994 | Kumihashi et al. |
| 5,392,018 A | * | 2/1995 | Collins et al. .............. 336/155 |
| 5,397,962 A | | 3/1995 | Moslehi |
| 5,401,350 A | * | 3/1995 | Patrick et al. .............. 156/345 |
| 5,404,079 A | | 4/1995 | Ohkuni et al. |
| 5,418,431 A | | 5/1995 | Williamson et al. |
| 5,421,891 A | | 6/1995 | Campbell et al. |
| 5,424,691 A | * | 6/1995 | Sadinsky ................... 333/17.3 |
| 5,429,070 A | | 7/1995 | Campbell et al. |
| 5,429,710 A | | 7/1995 | Akiba et al. |
| 5,429,995 A | | 7/1995 | Nishiyama et al. |
| 5,430,355 A | | 7/1995 | Paranjpe |
| 5,473,291 A | | 12/1995 | Brounley |
| 5,503,676 A | | 4/1996 | Shufflebotham et al. |
| 5,571,366 A | | 11/1996 | Ishii et al. |
| 5,573,595 A | | 11/1996 | Dible |
| 5,585,766 A | * | 12/1996 | Shel .......................... 333/17.3 |
| 5,591,493 A | | 1/1997 | Paranjpe et al. |
| 5,643,364 A | | 7/1997 | Zhao et al. |
| 5,688,357 A | | 11/1997 | Hanawa |
| 5,689,215 A | * | 11/1997 | Richardson et al. ........ 333/17.3 |
| 5,689,357 A | * | 11/1997 | Xu ........................... 204/192.3 |
| 5,716,451 A | | 2/1998 | Hama et al. |
| 5,759,280 A | * | 6/1998 | Holland et al. ........... 118/723 I |
| 5,793,162 A | | 8/1998 | Barnes et al. |
| 5,795,429 A | | 8/1998 | Ishii et al. |
| 5,800,619 A | * | 9/1998 | Holland et al. ........... 118/723 I |
| 5,800,688 A | | 9/1998 | Lantsman et al. |
| 5,851,600 A | | 12/1998 | Horiike et al. |
| 5,874,704 A | | 2/1999 | Gates |
| 5,961,793 A | * | 10/1999 | Ngan .................... 204/192.12 |
| 6,023,038 A | * | 2/2000 | Van Gogh ............. 219/121.43 |

OTHER PUBLICATIONS

EPO Search Report issued Aug. 13, 1999 in 98303813.4.

U.S. Serial No. 08/851,946 (Atty. Dkt. 1390.C1) date unknown.

U.S. Serial No. 08/853,024 (Atty. Dkt. 1186.P1) date unknown.

U.S. Serial No. 08/856,335 (Atty. Dkt. 1736) date unknown.

U.S. Serial No. 08/857,719 (Atty. Dkt. 1752) date unknown.

U.S. Serial No. 08/857,944 (Atty. Dkt. 1871) date unknown.

U.S. Serial No. 09/039,695 (Atty. Dkt. 1727) date unknown.

U.S. Serial No. 09/049,839 (Atty. Dkt. 938.D1) date unknown.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave Plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. application No. 08/680,335, filed Jul. 10, 1996, (Atty. Dk. 1390–CIP/PVD/DV).

U.S. application No. 08/461,575, filed Sep. 30, 1992, (Atty. Dk. 364.F1).

U.S. application No. 08/310,617, filed Sep. 30, 1992, (Atty. Dk. 364.P1), US Pat#5589229.

U.S. application No. 08/567,601, filed Jun. 2, 1995, (Atty. Dk. 364.P2), US Pat. #5803977.

U.S. application No. 08/733,620, filed Oct. 17, 1996, (Attorney Docket # 1457/PVD/DV).

U.S. application No. 08/730,722, filed Oct. 8, 1996, (Aty. Dk. 1207/MD/PVD/DV).

U.S. application No. 08/907,382, filed Aug. 7, 1997, (Aty. Dk. 1957/PVD/DV).

U.S. application No. 08/971,867, filed Nov. 19, 1997, (Aty. Dk. 1976.P1/MD/PVD/DV).

U.S. application No. 08/857,921, filed May 16, 1997, (Aty. Dk. 1737/ND/PVD/DV).

U.S. application No. 08/908,341, filed Aug. 7, 1997, (Aty. Dk. 1873/PVD/DV).

* cited by examiner

USE OF VARIABLE IMPEDANCE TO CONTROL COIL SPUTTER DISTRIBUTION

FIELD OF THE INVENTION

The present invention relates to plasma generators, and more particularly, to a method and apparatus for generating a plasma to sputter deposit a layer of material or to etch a layer of material in the fabrication of semiconductor devices.

BACKGROUND OF THE INVENTION

Low pressure plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate, being deposited, at angles which are oblique to the surface of the substrate. As a consequence, materials deposited in etched openings, including trenches and holes of semiconductor devices having openings with a high depth to width aspect ratio, may not adequately coat the walls of the openings, particularly the bottom walls. If a large amount of material is being deposited, the deposited material can bridge over, causing undesirable cavities in the deposition layer. To prevent such cavities, sputtered material can be redirected into substantially vertical paths between the target and the substrate by negatively biasing (or self-biasing) the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density, in the range of $10^{11}$–$10^{13}$ ions/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in a steady state. As shown in U.S. Pat. No. 4,362,632, for example, current through a coil is supplied by an RF generator coupled to the coil through an impedance-matching network, such that the coil acts as the first windings of a transformer. The plasma acts as a single turn second winding of a transformer.

Although ionizing the deposition material facilitates deposition of material into high aspect ratio channels and vias, many sputtered contact metals have a tendency to deposit more thickly in the center of the wafer as compared to the edges. This "center thick" deposition profile is undesirable in many applications where a uniform deposition thickness is needed.

As described in copending application Ser. No. 08/680,335, entitled "Coils for Generating a Plasma and for Sputtering," filed Jul. 10, 1996 (Attorney Docket # 1390CIP/PVD/DV) and assigned to the assignee of the present application, which application is incorporated herein by reference in its entirety, it has been recognized that the coil itself may provide a source of sputtered material to supplement the deposition material sputtered from the primary target of the chamber. Application of an RF signal to the coil can cause the coil to develop a negative bias which will attract positive ions which can impact the coil causing material to be sputtered from the coil. Because the material sputtered from the coil tends to deposit more thickly at the periphery of the wafer, the center thick tendency for material sputtered from the primary target can be compensated by the edge thick tendency for material sputtered from the coil. As a result, uniformity can be improved.

It has been recognized by the present applicant that the sputtering rate for material sputtered from the coil may be nonuniform around the perimeter of the coil. Hence the ability to achieve a desired level of uniformity may be adversely affected in some applications.

It has further been recognized by the present applicant that the coil can develop a hot spot which can cause uneven heating of the substrate. This uneven heating of the coil can also cause reliability problems in that portions of the coil may become too hot and deform, and may also cause particulates deposited on the coil to flake off and contaminate the substrate. Since single turn coils are typically required to carry a relatively high level of current, these problems can be more pronounced in such single turn coils.

SUMMARY OF THE PREFERRED EMBODIMENTS

It is an object of the present invention to provide a method and apparatus for etching or sputter depositing a layer which improves uniformity and which obviates, for practical purposes, the above-mentioned limitations.

These and other objects and advantages are achieved by a plasma generating apparatus in which, in accordance with one aspect of the invention, an impedance-circuit coupled to an RF coil has a tunable variable reactance for shifting RF voltage distributions along the length of the RF coil. It has been noted that the RF voltage distributions along the coil influence the plasma properties such as the plasma density and potential profiles and electron and ion movements including ion bombardment of the coil and substrate being deposited. It has further been noted that the instantaneous RF voltage distributions along the coil are not uniform or symmetric about the symmetry axis of the coil. These nonuniform and asymmetrical instantaneous RF voltage distributions along the coil can lead to nonuniform and asymmetrical heating of both the coil and the substrate as well as nonuniform sputtering of the coil and nonuniform deposition of material on the substrate.

In accordance with one aspect of the present invention, it has been found that the reactance between the RF coil and the ground can be cyclicly and continuously tuned during a sputtering operation to move or vary the RF voltage distributions along the RF coil so that minima and maxima points of the RF voltage distribution along the coil are not fixed at particular regions of the coil. Instead, the RF voltage distribution can be repeatedly moved around the coil in a rotational or other motion. In addition, the ionization pattern of the plasma associated with the RF voltage distribution may be similarly moved in conjunction with the movement of the RF voltage distribution. As a consequence, the RF coil and substrate can be more uniformly and symmetrically heated, by time-averaging, because a "hot spot" of sputtering can be avoided. In addition, the coil itself may be more uniformly sputtered and the deposition material can be more uniformly deposited.

In another aspect of the present invention, the reactance of the tunable variable reactance can be repeatedly changed during the deposition to shift the voltage distributions along the coil, without requiring corresponding impedance rematches as a result of the impedance changes. In many applications, it is desirable to match the impedance of the coil and associated impedance circuitry to the impedance of the RF generator so as to minimize the reflection of RF energy back to the generator. Here, the voltage distributions can be rotated during the deposition without having to rematch impedances because the combined impedances of the coil and the impedance network can remain substantially constant, even though the reactance of the tunable variable reactance is repeatedly changed during the deposition.

In one embodiment, the tunable variable reactance includes a pair of tunable inductors and a pair of linked core pieces movably disposed within the pair of tunable inductors in which one of the pair of tunable inductors is positioned between the RF coil and the ground. As explained in greater detail below, the core pieces compensate each change in the inductive reactance of one tunable inductor of the pair with a corresponding substantially equal but opposite change in the inductive reactance of the other tunable inductor of the pair so as to keep the sum of the inductive reactances of the tunable inductors of the pair substantially constant. As a result, the need to rematch the RF coil impedance, once the RF coil impedance has been adequately matched, can be reduced or eliminated.

In an alternative embodiment, the tunable variable reactance includes a pair of variable capacitors and a dielectric piece movably disposed within the pair of variable capacitors in which one of the pair of variable capacitors is positioned between the RF coil and the ground. The dielectric piece compensates a change in the capacitive reactance of one variable capacitor of the pair with a corresponding change in the capacitive reactance of the other variable capacitor of the pair so as to keep the sum of the capacitive reactances of the variable capacitors of the pair substantially constant.

DETAILED DESCRIPTION OF THE DRAWINGS

Figure 1:
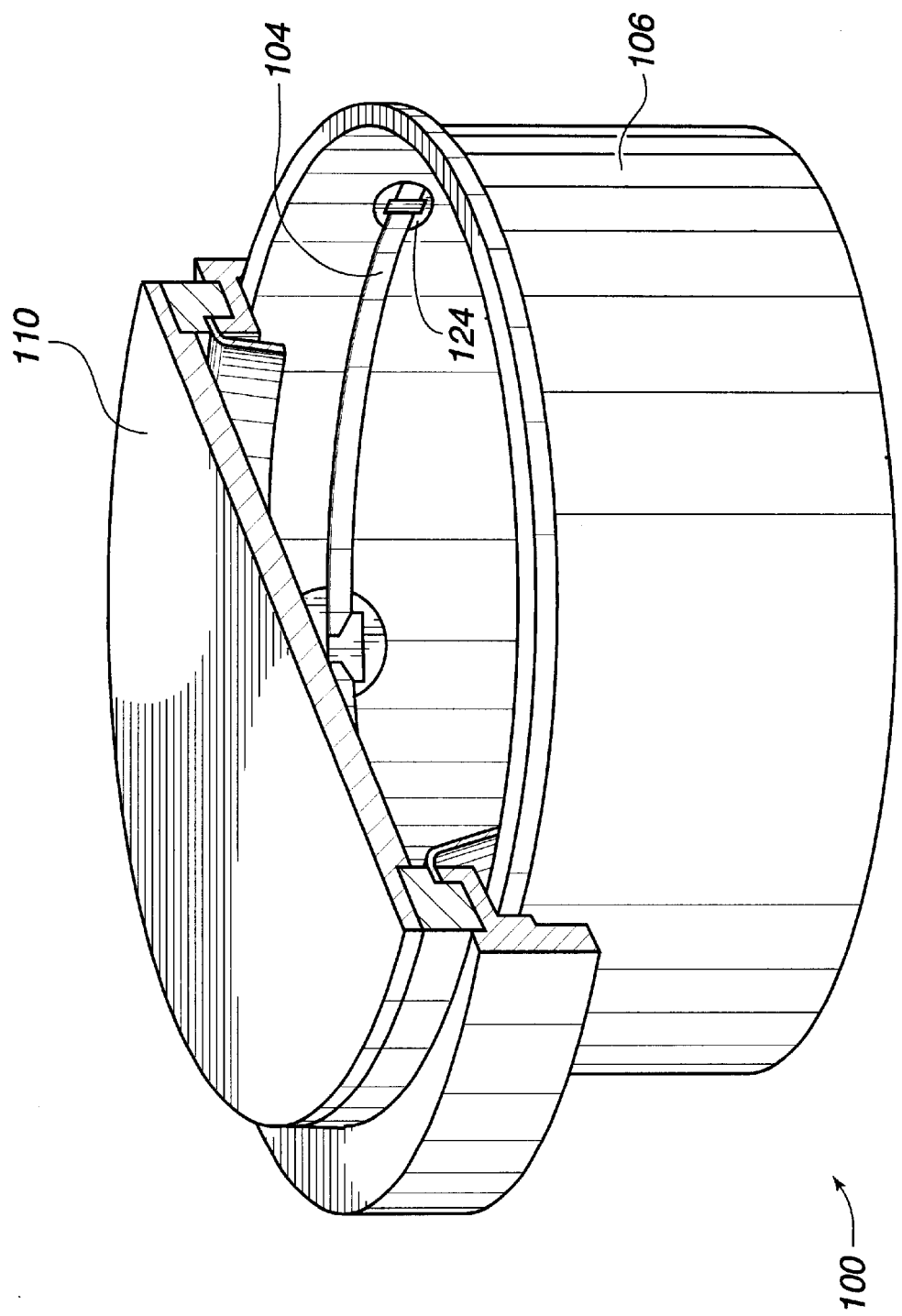
FIG. 1 is a perspective, partial cross-sectional view of a plasma generating chamber for sputter depositing a layer in a manner in accordance with an embodiment of the present invention.
Figure 2:
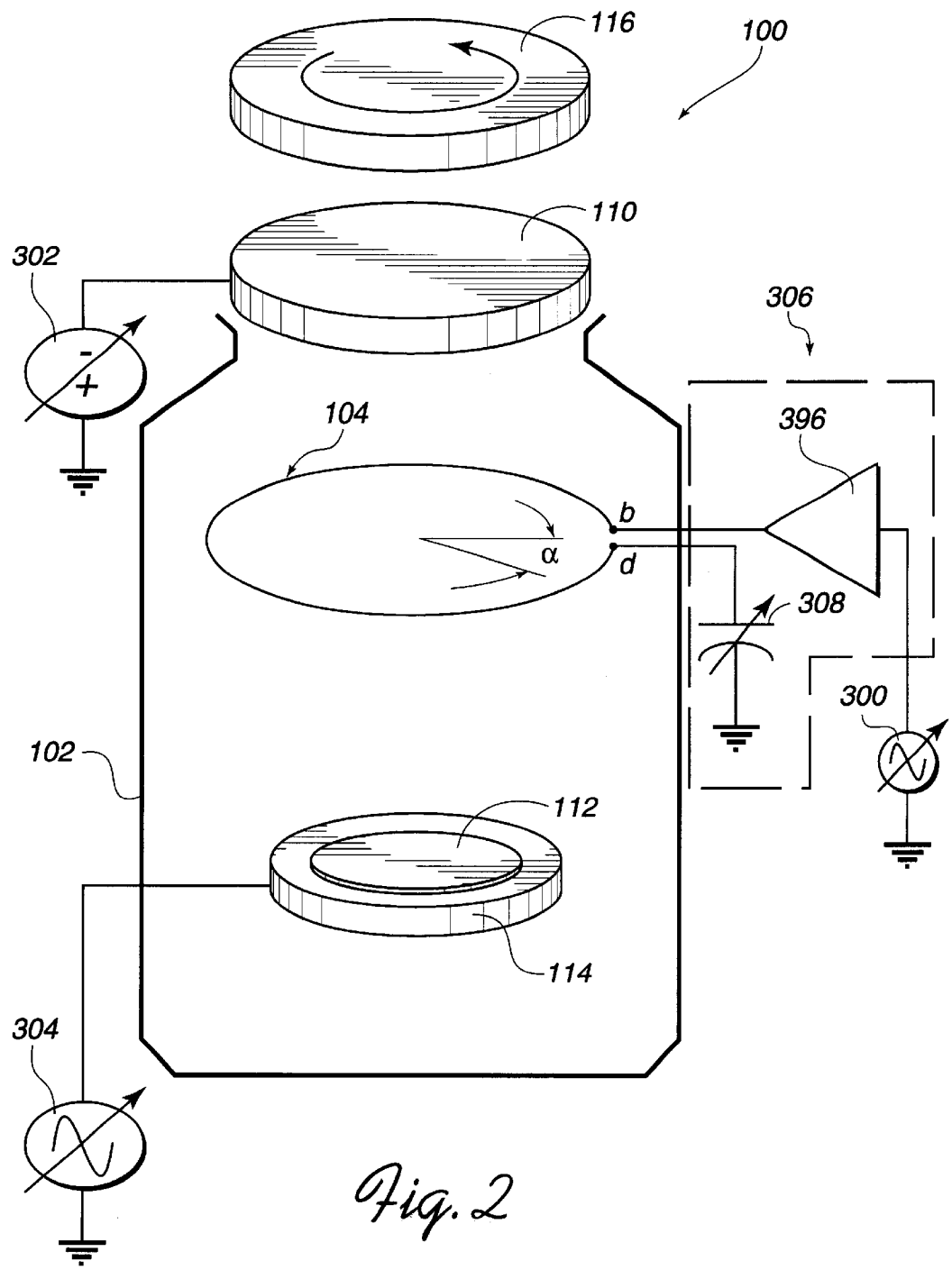
FIG. 2 is a schematic diagram of the electrical interconnections to the plasma generating chamber of FIG. 1.

Referring first to FIGS. 1–2, an example of a plasma generator used in accordance with an embodiment of the present invention comprises a substantially cylindrical plasma chamber 100 which is received in a vacuum chamber 102 (represented schematically in FIG. 2). The plasma chamber 100 of this embodiment has a helical coil 104 which is carried internally of the vacuum chamber walls by a chamber shield 106 which protects the interior walls of the vacuum chamber 102 from the material being deposited within the interior of the plasma chamber 100. In accordance with one aspect of the present invention, the reactance between the RF coil 104 and ground can be continuously or repeatedly tuned during a sputtering operation to cyclicly shift or rotate the RF voltage distributions along the RF coil 104, and to shift the associated ionization of the plasma. As a consequence, the RF coil 104 and substrate 112 are more uniformly and axially symmetrically heated, and the deposition material is more uniformly sputtered from the coil, by time-averaging. Further, the need to rematch the RF coil impedance once the RF coil impedance has been adequately matched can be eliminated notwithstanding the fact that the reactance between the RF coil 104 and the ground is repeatedly changed to shift the voltage distributions along the RF coil 104.

An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. An optional rotating magnet assembly 116 may be provided above the target 110 to produce magnetic fields which sweep over the face of the target 110 to promote uniform erosion by sputtering of the target 110.

Radio frequency (RF) energy from an RF generator 300 (FIG. 2) is radiated from the coil 104 into the interior of the plasma chamber 100, which energizes a plasma within the plasma chamber 100. The deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate. Although the illustrated embodiment is described in connection with sputter deposition, it is contemplated that the present invention is useful in connection with etching as well.

FIG. 2 includes a schematic representation of the electrical connections of the plasma generating apparatus of this illustrated embodiment. To sputter target material onto the substrate 112, the target 110 is preferably negatively biased by a variable DC power source 302 to attract the ions generated by the plasma. In the same manner, the pedestal 114 may be negatively biased by a variable RF power source 304 to bias the substrate 112 negatively to attract the ionized deposition material to the substrate 112. In an alternative embodiment, the pedestal 114 may be biased by a high frequency AC power source to bias the substrate 112 so as to attract the ionized deposition material more uniformly to the substrate 112. In yet another alternative embodiment, external biasing of the substrate 112 may be omitted.

One end b of the coil 104 is coupled to an RF source such as the output of an amplifier 396 and impedance-matching network 306, the input of which is coupled to the RF generator 300. The other end d of the coil 104 is coupled to ground, preferably through a capacitor 308, which may be a variable capacitor. The amplifier 396 and impedance-matching network 306 adjust the combined impedances of the RF coil 104 and the network 306 to match the impedance of the RF generator 300 so that RF energy will be efficiently transmitted from the RF generator 300 to the RF coil 104 rather than being reflected back to the generator 300.

As set forth above, it has been noted that the RF voltage distributions along the coil 104 can influence various properties of the plasma. These plasma properties including the plasma density and potential profiles, and ion bombardment of the coil 104 and substrate 112 being deposited. Because the instantaneous RF voltage distributions along the coil 104 are not uniform and are not axially symmetric about the symmetry axis of the coil 104, nonuniform and asymmetrical heating of both the coil 104 and the substrate 112 can occur as well as nonuniform sputtering of the coil and deposition of material on the substrate 112. Thus, nonuniform and asymmetrical heating of the coil 104 can cause reliability problems, in that portions of the coil 104 may become too hot and deform, and may also lead to the flaking of particulates deposited on the coil 104 which can contaminate the substrate 112. The nonuniform and asymmetrical instantaneous RF voltage distributions along the coil 104 and the consequent nonuniform effects can be most prominent when the coil 104 is a single turn coil.

In accordance with the present invention, the reactance between the RF coil 104 and the ground can be continuously changed or tuned in repeating cycles during a sputtering operation to vary or move the RF voltage distributions along the RF coil 104, and thereby also rotate the ionization profile of the plasma. As the voltage profile is varied to continuously move the minimum, peak or other reference points of the voltage around the coil in an orbital or other path about the plasma region, the regions of plasma having varying ionization fractions, or rates may in effect rotate about an axis within the plasma region. As a consequence, the RF coil 104 and substrate 112 can be more uniformly and axially symmetrically heated, and the target material can be more uniformly deposited, by time-averaging, because the regions of highest to lowest ionization fraction (or plasma density) can more equally contribute to sputtering of the coil and target. In another aspect of the present invention, the need to rematch the RF coil impedance once the RF coil impedance has been adequately matched can be eliminated notwithstanding the fact that the reactance between the RF coil 104 and the ground is continuously or repeatedly changed to shift the voltage distributions along the RF coil 104.

Figure 3:
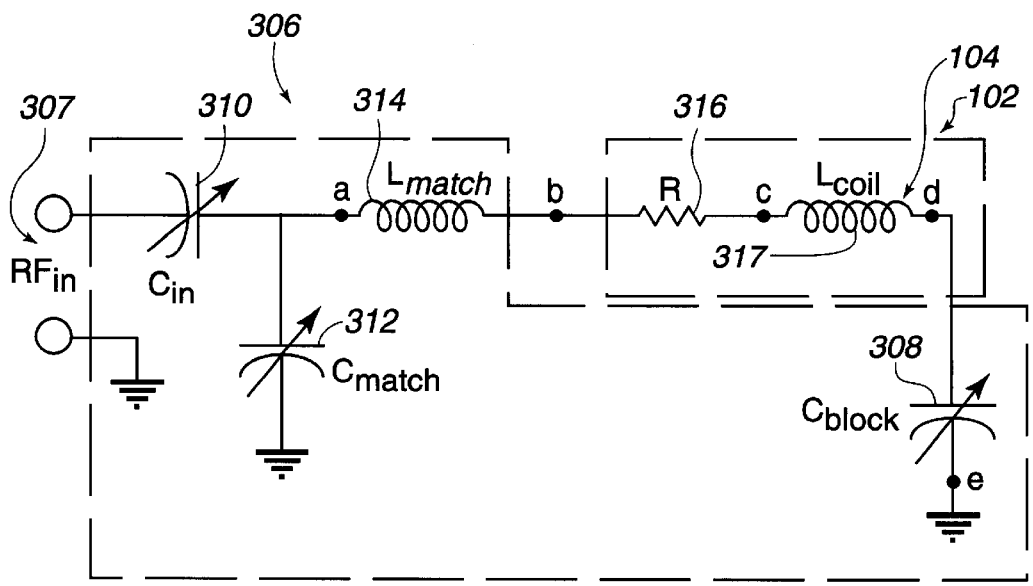
FIG. 3 is a schematic diagram according to one embodiment of the impedance-matching network and the plasma generating chamber of FIG. 2.

FIG. 3 is a schematic diagram illustrating one embodiment of an impedance-matching network 306 having an input capacitor 310 with a variable capacitance $C_{in}$, a parallel match capacitor 312 with a variable capacitance $C_{match}$ and a series match inductor 314 with an inductance $L_{match}$ coupled through the vacuum chamber 102 to one end of the coil 104. A blocking capacitor 308 is coupled through the vacuum chamber 102 to the other end of the coil 104. The coil 104 has an associated inductance $L_{coil}$ and a resistance R as shown by an equivalent resistor 316 and inductor 317. The input of the impedance-matching network 306 is coupled to the RF generator 300 through RF input 307.

One function of the network 306 is to match the impedance of the coil 104 combined with that of the network 306 to the impedance of the RF generator 300 to minimize the reflection of RF energy back to the generator to maximize the coupling of RF energy from the coil 104 to the plasma in the chamber. Accordingly, for a particular coil impedance $L_{coil}$ of the coil 104, the values of the input capacitor 310, match capacitor 312, match inductor 314, and blocking capacitor 308, are chosen to provide a close match to the RF generator impedance which may be 50 ohms, for example. In a manner similar to that of prior impedance matching circuits, the impedances of the input capacitor $C_{in}$ and match capacitor $C_{in}$ may be finely tuned both prior to deposition and also during deposition to achieve and maintain a more precise match by adjusting the variable capacitances of the input capacitor 310 and match capacitor 312.

The value $C_{block}$ of the blocking capacitor 308, like that of blocking capacitors of prior impedance matching circuits, is also chosen so as to provide a large impedance to the RF energy being applied to the coil 104, so that the coil 104 develops a substantial DC bias. However, in accordance with one aspect of the present invention, the impedance value $C_{block}$ of the blocking capacitor may nonetheless be changed in repeating cycles during the deposition so as to cyclicly shift the distribution of voltages around the coil 104 so as to increase the uniformity of sputtering rate and coil heating for each portion of the coil 104. This may be understood from the following:

The effective potential difference $V_{eff}$ between any two points of the alternating current (AC) series circuit from point a to point e in FIG. 3 equals the product of the effective current $I_{eff}$ and impedance Z of the AC circuit between the respective points. The effective potential difference $V_{ab}$ between points a and b across series inductor 314 with an inductance $L_{match}$ is given by $$V_{ab}=I_{eff}Z_{ab}=IZ_{ab}$$

where the impedance $Z_{ab}$ across series inductor 314 with an inductance $L_{match}$ is given by $$Z_{ab}=\sqrt{R_{ab}^2+X_{ab}^2}=X_{L_{match}}=\omega L_{match}$$

where the inductive reactance $X_L$ of an inductor with inductance L is given by $X_L=\omega L$ where $\omega$ is the angular frequency of the instantaneous potential difference v given by $$v=V_{max}\sin(\omega t)=\sqrt{2}V_{eff}\sin(\omega t)=\sqrt{2}V_{eff}\sin(2\pi f t)$$

where f is the frequency (in Hertz) and where the instantaneous current i is given by $i = I_{max} \sin(\omega t - \phi) = \sqrt{2} I_{eff} \sin(\omega t - \phi) = \sqrt{2} I \sin(\omega t - \phi)$ and the phase angle $\phi_{ab}$ between the instantaneous potential difference $V_{ab}$ and the instantaneous current i across series inductor 314 with an inductance $L_{match}$ is given by $$\phi_{ab} = \tan^{-1}\left(\frac{X_{ab}}{R_{ab}}\right) = \tan^{-1}\left(\frac{\omega L_{match}}{0}\right) = \tan^{-1}(+\infty) = +\frac{\pi}{2}$$

so that the instantaneous potential difference $v_{ab}$ across series inductor 314 leads the instantaneous current i in the series inductor 314 by 90° and the effective potential difference $V_{ab}$ is equal to $I\omega L_{match}$ between points a and b across series inductor 314.

The effective potential difference $V_{bc}$ between points b and c across series resistor 316 with an effective resistance R is given by $V_{bc} = IZ_{bc}$ where the impedance $Z_{bc}$ across series resistor 316 with an effective resistance R is given by $Z_{bc} = \sqrt{R_{bc}^2 + X_{bc}^2} = R$ where the phase angle $\phi_{bc}$ between the instantaneous potential difference $v_{bc}$ and the instantaneous current i across series resistor 316 with an effective resistance R is given by $$\phi_{bc} = \tan^{-1}\left(\frac{X_{bc}}{R_{bc}}\right) = \tan^{-1}\left(\frac{0}{R}\right) = \tan^{-1}(0) = 0$$

so that the instantaneous potential difference $v_{bc}$ across series resistor 316 is in phase with the instantaneous current i in the series resistor 316 and the effective potential difference $V_{bc}$ is equal to IR between points b and c across series resistor 316.

The effective potential difference $V_{cd}$ between points c and d across coil 104 with an inductance $L_{coil}$ is given by $V_{cd} = IZ_{cd}$ where the impedance $Z_{cd}$ across coil 104 with an inductance $L_{coil}$ is given by $$Z_{cd} = \sqrt{R_{cd}^2 + X_{cd}^2} = X_{L_{coil}} = \omega L_{coil}$$

where the phase angle $\phi_{cd}$ between the instantaneous potential difference $v_{cd}$ and the instantaneous current i across coil 104 with an inductance $L_{coil}$ is given by $$\phi_{cd} = \tan^{-1}\left(\frac{X_{cd}}{R_{cd}}\right) = \tan^{-1}\left(\frac{\omega L_{coil}}{0}\right) = \tan^{-1}(+\infty) = +\frac{\pi}{2}$$

so that the instantaneous potential difference $v_{cd}$ across coil 104 leads the instantaneous current i in the series inductor by 90° and the effective potential difference $V_{cd}$ is equal to $I\omega L_{coil}$ between points c and d across coil 104.

The effective potential difference $V_{de}$ between points d and e across blocking variable capacitor 308 with a variable capacitance $C_{block}$ is given by $V_{de} = IZ_{de}$ where the impedance $Z_{de}$ across blocking variable capacitor 308 with a variable capacitance Cblock is given by $$Z_{de} = \sqrt{R_{de}^2 + X_{de}^2} = X_{C_{block}} = \frac{1}{\omega C_{block}}$$

where the capacitive reactance $X_C$ of a capacitor with capacitance C is given by $X_C = (\omega C)^{-1}$ and the phase angle $\phi_{de}$ between the instantaneous potential difference $v_{de}$ and the instantaneous current i across blocking variable capacitor 308 with a variable capacitance $C^{block}$ is given by $$\phi_{de} = \tan^{-1}\left(\frac{X_{de}}{R_{de}}\right) = \tan^{-1}\left(\frac{-\frac{1}{\omega C_{block}}}{0}\right) = \tan^{-1}(-\infty) = -\frac{\pi}{2}$$

so that the instantaneous potential difference $v_{de}$ across blocking variable capacitor 308 lags the instantaneous current i in the blocking variable capacitor 308 by 90° and the effective potential difference $V_{de}$ is equal to $I(\omega C_{block})^{-1}$ between points d and e across blocking variable capacitor 308.

For a given angular frequency $\omega$, the blocking variable capacitor 308 may be chosen to have a variable capacitance $C_{block}$ so that the effective potential difference $V_{de} = I(\omega C_{block})^{-1}$ between points d and e across blocking variable capacitor 308 is substantially equal to the effective potential difference $V_{cd} = I\omega L_{coil}$ between points c and d across coil 104. The instantaneous potential difference $v_{de}$ across blocking variable capacitor 308 would then lag the instantaneous potential difference $v_{cd}$ across coil 104 by 180° and the instantaneous potential difference $v_{de}$ across blocking variable capacitor 308 consequently would be completely out of phase with the instantaneous potential difference $v_{cd}$ across coil 104. Ignoring the effect of any bias induced on the coil such as a substantially constant DC offset bias or a DC self-bias, the effective potential V vanishes (V=0) at point c so that a hypothetical voltmeter (not shown) measuring the potential differences between point c and point e would read zero.

For a particular angular frequency $\omega$), the variable capacitance $C_{block}$ of the blocking variable capacitor 308 may be chosen so that the effective potential difference $V_{de} = I(\omega C_{block})^{-1}$ between points d and e across blocking variable capacitor 308 is substantially equal to half the effective potential difference $V_{cd} = I\omega L_{coil} = 2V_{de} = 2I(\omega C_{block})^{-1}$ between points c and d across coil 104. The instantaneous potential difference $V_{de}$ across blocking variable capacitor 308 would again lag the instantaneous potential difference $v_{cd}$ across coil 104 by 180° and the instantaneous potential difference $v_{de}$ across blocking variable capacitor 308 consequently would again be completely out of phase with the instantaneous potential difference $v_{cd}$ across coil 104. Again, ignoring for the moment any DC offset bias or a DC self-bias, the effective potential V vanishes (V=0) at a point along the coil 104 substantially halfway between point c and point d so that a hypothetical voltmeter (not shown) placed between the point (substantially halfway between point c and point d) and point e would read zero.

Similarly, the variable capacitance $C_{block}$ of the blocking variable capacitor 308 may be chosen so that the effective potential difference $V_{de} = I(\omega C_{block})^{-1}$ between points d and e across blocking variable capacitor 308 is substantially equal to $n^{-1}$ times the effective potential difference $V_{cd} = I\omega L_{coil} = nV_{de} = nI(\omega C_{block})^{-1}$ between points c and d across coil 104, where n is any positive real number. The instantaneous potential difference $v_{de}$ across blocking variable capacitor 308 would again lag the instantaneous potential difference $v_{cd}$ across coil 104 by 180° and the instantaneous potential difference $v_{de}$ across blocking variable capacitor 308 consequently would again be completely out of phase with the instantaneous potential difference $v_{cd}$ across coil 104. It is believed that the effective potential V vanishes (V=0) at a point along the coil 104 substantially $(n-1)n^{-1}$ of the way between point c and point d so that a voltmeter (not shown) between the point (substantially $(n-1)n^{-1}$ of the way between point c and point d) and point e would read zero. In the limit that n becomes very large, the point where the effective potential V vanishes (V=0) along the coil 104 approaches arbitrarily close to point d.

Alternatively, for a constant angular frequency ω, the variable capacitance $C_{block}$ of the blocking variable capacitor 308 may be chosen so that the effective potential difference $V_{de}=I(\omega C_{block})^{-1}$ between points d and e across blocking variable capacitor 308 is substantially equal to $(n-1)n^{-1}$ times the effective potential difference $V_{cd}=I\omega L_{coil}=(n-1)^{-1}nV_{de}=(n-1)^{-1}nI(\omega C_{block})^{-1}$ between points c and d across coil 104, where n is any positive real number. The instantaneous potential difference $v_{de}$ across blocking variable capacitor 308 would again lag the instantaneous potential difference $v_{cd}$ across coil 104 by 180° and the instantaneous potential difference $v_{de}$ across blocking variable capacitor 308 consequently would again be completely out of phase with the instantaneous potential difference $v_{cd}$ across coil 104. Ignoring any DC offset bias or a DC self-bias, the effective potential V vanishes (V=0) at a point along the coil 104 substantially $n^{-1}$ of the way between point c and point d so that a voltmeter (not shown) between the point (substantially $n^{-1}$ of the way between point c and point d) and point e would read zero. In the limit that n becomes very large, the point where the effective potential V vanishes (V=0) along the coil 104 approaches arbitrarily close to point c.

The above examples demonstrate that the variable capacitance $C_{block}$ of the blocking variable capacitor 308 may be chosen so that the effective potential V may be made to vanish (V=0) at any point along the coil 104 between point c and point d. This ability to vary over time the point along the coil 104 at which the effective potential V vanishes (V=0) may be used to shift the RF voltage distributions along the coil 104, and to shift the ionization of the plasma. As a consequence, the coil 104 and substrate 112 are more uniformly and axially symmetrically heated, and the material sputtered from the target 110 can be more uniformly ionized and deposited, by time-averaging, on the substrate 112.

When the coil 104 is biased by a substantially constant DC offset bias, or a DC self-bias, $V_{bias}$, the variable capacitance $C_{block}$ of the blocking variable capacitor 308 may be chosen so that the effective potential V may be made to equal the substantially constant DC offset bias or the DC self-bias ($V=V_{bias}$) at any point along the coil 104 between point c and point d. This ability to vary over time the point along the coil 104 at which the effective potential V equals the substantially constant DC offset bias or the DC self-bias ($V=V_{bias}$) may also be used to shift the RF voltage distributions along the coil 104, and to shift the ionization of the plasma. As a consequence, the coil 104 and substrate 112 are more uniformly and axially symmetrically heated, and the material sputtered from the target 110 is more uniformly deposited, by time-averaging, on the substrate 112.

Figure 13:
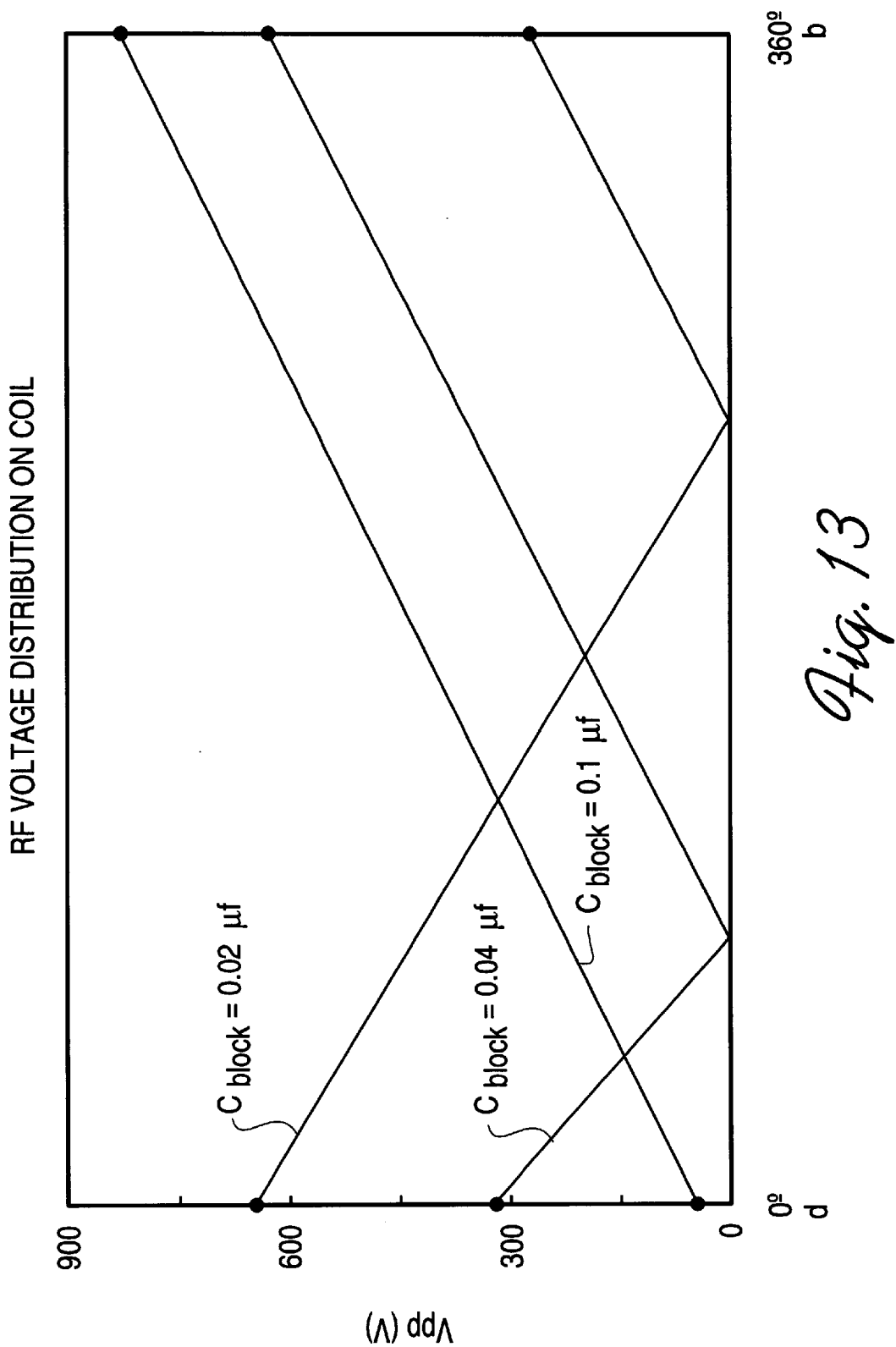
FIG. 13 is a graph depicting shifts in RF voltage distribution along a coil as a function of impedance change.

FIG. 13 is a graph depicting one example of how the RF voltage distributions may shift along the coil as the impedance of the blocking capacitor $C_{block}$ is changed during deposition. In FIG. 13, the distributions of peak to peak RF voltage $V_{pp}$ on the coil 104 are shown as a function of position on the one turn coil 104 represented by coil angle α (FIG. 2) in which coil angle α=0° corresponds to end d (FIG. 3) of the coil and coil angle α=360° corresponds to end b of the coil 104 at which the RF feedthroughs are coupled to the coil. These distribution are based upon voltage measurements at two locations on the coil (α=0° and α=360°). The voltage values depicted for the remaining coil locations (0°<α<360°) are expected values rather than measurements.

In one distribution, when the capacitance of the blocking capacitor $C_{block}$ has a value of 0.04 μf, the peak to peak RF voltage $V_{pp}$ at end α=0° may start at 300 volts and is believed to decrease to 0 volts at approximately coil location α=90°. The RF voltage then increases at succeeding locations around the coil until the other end b of the coil (α=360°) is reached where the peak to peak RF voltage has a value of approximately 600 volts. Because the peak to peak voltage is greatest at the coil location corresponding to coil angle α=360°, a hot spot may develop at that point. However, if in accordance with the present invention, the capacitance of the blocking capacitor $C_{block}$ is changed to another value while the deposition is proceeding, the hot spot may be shifted.

Thus, if the capacitance of the blocking capacitor $C_{block}$ is changed to 0.02 μf, for example, the voltage distribution will shift in this example so that the distribution is effectively reversed as shown. More specifically, at this capacitance, the peak to peak RF voltage $V_{pp}$ at end α=0° may start somewhat above 600 volts and is believed to continuously decrease at succeeding locations around the coil until coil location α≈240° is reached where $V_{pp}$ is believed to be equal to 0 volts. The RF voltage then increases until the other end b of the coil (α=360°) is reached where the peak to peak RF voltage has a value of approximately 300 volts. Accordingly, the hot spot will shift to the other end of the coil at coil angle α=0°. By appropriately changing the impedance of the blocking capacitor $C_{block}$ as the deposition proceeds, the hot spot may be shifted to intermediate positions along the coil circumference to more evenly distribute the hot spots and thus more evenly heat and sputter the coil.

As the voltage distribution is shifted, the maximum and minimum values along the coil can change as well. Thus, as shown in FIG. 13, if the capacitance of the blocking capacitor $C_{block}$ is changed to 0.01 μf, for example, the voltage distribution will shift in this example so that the peak to peak RF voltage $V_{pp}$ at end α=0° may start at close to 0 volts and may continuously increase until the other end b of the coil (α=360°) is reached where the peak to peak RF voltage has a value of approximately 800 volts. Accordingly, the maximum and minimum values of the voltage distribution may change as well as the locations of the maximum and minimum values as the impedance is changed as the deposition progresses to more evenly heat and sputter the coil.

Figure 4:
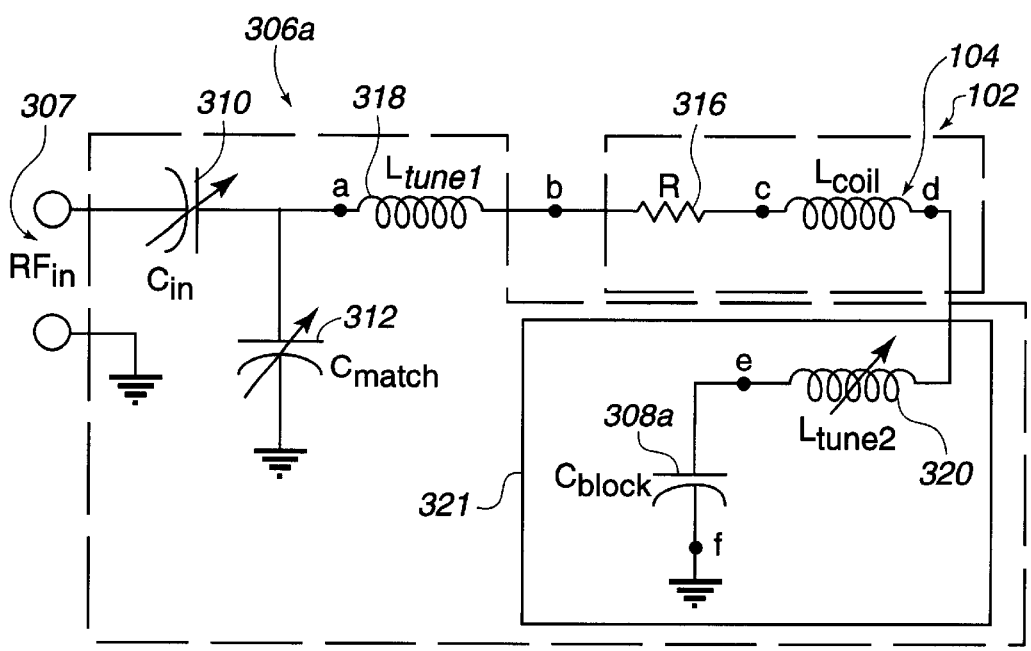
FIG. 4 is a schematic diagram according to another embodiment of the impedance-matching network and the plasma generating chamber of FIG. 2.

In those applications where a high degree of impedance matching is desired, the impedance of the input capacitor 310 or the match capacitor 312 may be adjusted so as to maintain a good match as the impedance of the blocking capacitor 308 is varied to rotate the voltage distributions around the coil 104. However, in some applications, the changes in impedance of the blocking capacitor 308 may be of a magnitude for which the matching circuit may experience difficulty in quickly matching these changes to maintain good energy throughput to the coil 104. FIG. 4 is directed to another embodiment which reduces or eliminates the need for tuning the impedances of matching components in response to changes to component impedances for the purpose of shifting or rotating voltage distributions around the coil.

FIG. 4 schematically shows another embodiment of an impedance-matching network 306a which, like the network 306 includes a series variable input capacitor 310, a parallel variable match capacitor 312. However, instead of the match inductor 314, the network 306a has a series tunable inductor 318 with a tunable inductance $L_{tune1}$ coupled through the vacuum chamber 102 to one end of the coil 104. Also, the network includes a block impedance 321 comprising a series tunable inductor 320 with a tunable inductance $L_{tune2}$, and a blocking capacitor 308a with a capacitance $C_{block}$. In accordance with another aspect of the present invention, the impedance values of components other than that of the blocking capacitor may be repeatedly changed during the deposition so as to shift the distribution of voltages around the coil 104. This may be understood from the following:

$$V_{ab}=IZ_{ab}$$

Here, the impedance $Z_{ab}$ across series tunable inductor 318 with a tunable inductance $L_{tune1}$ is given by $$Z_{ab}=\sqrt{R_{ab}^2+X_{ab}^2}X_{L_{tune1}}=\omega L_{tune1}$$

and the phase angle $\phi_{ab}$ between the instantaneous potential difference $v_{ab}$ and the instantaneous current i across series tunable inductor 318 with a tunable inductance $L_{tune1}$ is given by $$\phi_{ab} = \tan^{-1}\left(\frac{X_{ab}}{R_{ab}}\right) = \tan^{-1}\left(\frac{\omega L_{tune1}}{0}\right) = \tan^{-1}(+\infty) = +\frac{\pi}{2}$$

so that the instantaneous potential difference $v_{ab}$ across series tunable inductor 318 leads the instantaneous current i in the series tunable inductor 318 by 90° and the effective potential difference $V_{ab}$ is equal to $I\omega L_{tune1}$ between points a and b across tunable inductor 318.

As set forth above, the effective potential difference $V_{bc}$ between points b and c across series resistor 316 with an effective resistance R is given by $$V_{bc}=IR$$

and the instantaneous potential difference $v_{cd}$ across coil 104 leads the instantaneous current i in the series inductor by 90° and the effective potential difference $V_{cd}$ is equal to $I\omega L_{coil}$ between points c and d across coil 104.

The effective potential difference $V_{de}$, between points d and e across series tunable inductor 320 with a tunable inductance $L_{tune2}$ is given by $$V_{de}=IZ_{de}$$

where the impedance $Z_{de}$ across series tunable inductor 320 with a tunable inductance $L_{tune2}$ is given by $$Z_{de}=\sqrt{R_{de}^2+X_{de}^2}=X_{L_{tune2}}=\omega L_{tune2}$$

and the phase angle $\alpha_{de}$ between the instantaneous potential difference $v_{de}$ and the instantaneous current i across series tunable inductor 320 with a tunable inductance $L_{tune2}$ is given by $$\phi_{de} = \tan^{-1}\left(\frac{X_{de}}{R_{de}}\right) = \tan^{-1}\left(\frac{\omega L_{tune2}}{0}\right) = \tan^{-1}(+\infty) = +\frac{\pi}{2}$$

so that the instantaneous potential difference $v_{de}$ across series tunable inductor 320 leads the instantaneous current i in the series tunable inductor 320 by 90° and the effective potential difference $V_{de}$ is equal to $I\omega L_{tune2}$ between points d and e across tunable inductor 320.

The effective potential difference $V_{ef}$ between points e and f across blocking capacitor 308a with a fixed capacitance $C_{block}$ is given by $$V_{ef}=IZ_{ef}$$

where the impedance $Z_{ef}$ across blocking capacitor 308a with a capacitance $C_{block}$ is given by $$Z_{ef} = \sqrt{R_{ef}^2+X_{ef}^2} = X_{C_{block}} = \frac{1}{\omega C_{block}}$$

and the phase angle $\phi_{ef}$ between the instantaneous potential difference $v_{ef}$ and the instantaneous current i across blocking capacitor 308a with a capacitance $C_{block}$ is given by $$\phi_{ef} = \tan^{-1}\left(\frac{X_{ef}}{R_{ef}}\right) = \tan^{-1}\left(\frac{-\frac{1}{\omega C_{block}}}{0}\right) = \tan^{-1}(-\infty) = -\frac{\pi}{2}$$

so that the instantaneous potential difference $v_{ef}$ across blocking capacitor 308a lags the instantaneous current i in the blocking capacitor 308a by 90° and the effective potential difference $V_{ef}$ is equal to $I(\omega C_{block})^{-1}$ between points e and f across blocking capacitor 308a.

For a given angular frequency $\omega$, the series tunable inductor 320 may be chosen to have a tunable inductance $L_{tune2}$ so that the effective potential difference $V_{de}=I\omega L_{tune2}$ between points d and e across tunable inductor 320 is substantially equal to the difference between the effective potential difference $V_{ef}=I(\omega C_{block})^{-1}$ between points e and f across blocking capacitor 308a and the effective potential difference $V_{cd}=I\omega L_{coil}$ between points c and d across coil 104, so that $V_{de}=I\omega L_{tune2}=V_{ef}-V_{cd}=I(\omega C_{block})^{-1}-I\omega L_{coil}$. The instantaneous potential difference $v_{ef}$ across blocking capacitor 308a would then lag both the instantaneous potential difference $v_{cd}$ across coil 104 and the instantaneous potential difference $v_{de}$ across series tunable inductor 320 by 180° and the instantaneous potential difference $v_{ef}$ across blocking variable capacitor 308a consequently would be completely out of phase with both the instantaneous potential difference $v_{cd}$ across coil 104 and the instantaneous potential difference $v_{de}$ across series tunable inductor 320. Ignoring any DC offset bias or a DC self-bias, the effective potential V vanishes (V=0) at point c so that a voltmeter (not shown) between point c and point f would read zero.

Similarly, the series tunable inductor 320 may be chosen to have a tunable inductance $L_{tune2}$ so that the effective potential difference $V_{de}=I\omega L_{tune2}$ between points d and e across tunable inductor 320 is substantially equal to the difference between $(n-1)^{-n}$ times the effective potential difference $V_{ef}=I(\omega C_{block})^{-1}$ between points e and f across blocking capacitor 308a and the effective potential difference $V_{cd}=I\omega L_{coil}$ between points c and d across coil 104, so that $$V_{de}=I\omega L_{tune2}=(n-1)^{-1}nV_{ef}-V_{cd}=(n-1)^{-1}nI(\omega C_{block})^{-1}-I\omega L_{coil},$$

where n is any positive real number. The instantaneous potential difference $V_{ef}$ across blocking capacitor 308a would then lag both the instantaneous potential difference $v_{cd}$ across coil 104 and the instantaneous potential difference $v_{de}$ across series tunable inductor 320 by 180° and the instantaneous potential difference $v_{de}$ across blocking variable capacitor 308a consequently would be completely out of phase with both the instantaneous potential difference $V_{cd}$ across coil 104 and the instantaneous potential difference $v_{de}$ across series tunable inductor 320. Again, ignoring any DC offset bias or a DC self-bias, the effective potential V vanishes (V=0) at a point along the coil 104 substantially $n^{-1}$ of the way between point c and point e so that a voltmeter (not shown) between the point (substantially $n^{-1}$ of the way between point c and point e) and point f would read zero. In the limit that n becomes very large, the point where the effective potential V vanishes (V=0) along the coil 104 approaches arbitrarily close to point c.

Thus, the tunable inductance $L_{tune2}$ of the series tunable inductor 320 may be chosen so that the effective potential V may be made to vanish (V=0) at substantially any point along the coil 104 between point c and point d. This ability to vary over time the point along the coil 104 at which the effective potential V vanishes (V=0) may be used to shift the RF voltage distributions along the coil 104, and to shift the ionization pattern associated with a particular voltage distribution. As a consequence, the coil 104 and substrate 112 can be more uniformly and axially symmetrically heated, and the material sputtered more uniformly from the coil 104.

In addition, the two series tunable inductors 318 and 320 may be tuned substantially simultaneously in a complementary fashion so that the sum of the tunable inductances ($L_{tune1}+L_{tune2}$) remains substantially constant. Such an arrangement can reduce or eliminate the need for rematching the impedances of the coil 104, the blocking impedance 321 and the matching network 306a as the impedance of the tunable inductor 320 is varied to rotate the voltage distribution along the coil 104. As shown in FIG. 4, the matching capacitor 312 and the input capacitor 310 of the matching network 306a are coupled to an impedance which is the impedance of the series coupled components from point a to point f in FIG. 4. This impedance, which may be represented as the impedance $Z_{af}$, is defined by the impedances of these components, including the coil 104, as set forth below:

$$Z_{af} = \sqrt{R^2 + \left((\omega L_{tune1} + \omega L_{coil} + \omega L_{tune2}) - \frac{1}{\omega C_{block}}\right)^2}$$

It is seen that if the impedances of the coil 104 (i.e., $(R^2+(\omega L_{coil})^2)^{1/2}$) and the blocking capacitor 308a (i.e., $1/(\omega C_{block})$) are fixed, and the sum of the impedances of the tunable inductances 318 and 320 (i.e., $\omega L_{tune1}+\omega L_{tune2}$) is also constant, that the impedance $Z_{af}$ of the series coupled components from point a to point f in FIG. 4 will be constant even though the impedance $\omega L_{tune2}$ of the tunable inductor 320 can be repeatedly changed to rotate the voltage distribution along the coil 104. Indeed, the change of the impedance $Z_{af}$ with time is believed to be given by:

$$\frac{dZ_{af}}{dt} = \frac{\left((\omega L_{tune1} + \omega L_{coil} + \omega L_{tune2}) - \frac{1}{\omega C_{block}}\right)\left(\frac{d(\omega L_{tune1})}{dt} + \frac{d(\omega L_{tune2})}{dt}\right)}{\sqrt{R^2 + \left((\omega L_{tune1} + \omega L_{coil} + \omega L_{tune2}) - \frac{1}{\omega C_{block}}\right)^2}}$$

using the fixed impedances of the coil 104 and the blocking capacitor 308a, which shows that the impedance $Z_{af}$ is constant provided that the sum of the impedances of the tunable inductances 318 and 320 (i.e., $\omega L_{tune1}+\omega L_{tune2}$) is constant. It is believed that when the resistance R of the coil 104 is negligible in comparison to the reactance (i.e., $R<<\omega L_{tune1}+\omega L_{coil}+\omega L_{tune2}-1/(\omega C_{block})$), then the impedance $Z_{af}$ is approximately:

$$Z_{af} \approx (\omega L_{tune1} + \omega L_{coil} + \omega L_{tune2}) - \frac{1}{\omega C_{block}}$$

so that the change of the impedance $Z_{af}$ with time is approximately:

$$\frac{dZ_{af}}{dt} \approx \frac{d(\omega L_{tune1})}{dt} + \frac{d(\omega L_{tune2})}{dt}$$

which again substantially vanishes as long as the sum of the impedances of the tunable inductances 318 and 320 (i.e., $\omega L_{tune}+\omega L_{tune2}$) is substantially constant.

Consequently, the impedances of the input capacitor 310 and/or the matching capacitor 312 need not be adjusted to maintain an impedance match with the generator 300 as a result of changes to the tunable inductor 320. Instead, adjustments to the input capacitor 310 and/or the matching capacitor 312 may be limited to those normally encountered as a result of the usual variations in the effective inductance of the coil 104 caused by changes to the plasma and other causes during an ongoing deposition. Such an arrangement can reduce or eliminate the need for rematching the impedances of the coil 104 and the impedance-matching network 306a to the RF generator 300 as the impedance of the tunable induction 320 is varied to rotate the voltage distribution along the coil 104.

A typical time constant for rematching the impedance of the coil 104 using typical impedance-matching networks is on the order of a few seconds for frequency auto-tuning and more than a few seconds for mechanical auto-tuning. In the embodiment of FIG. 3, if the variable capacitance $C_{block}$ of the variable blocking capacitor 308 is varied over time to rotate the RF voltage distributions along the coil 104, and to rotate the plasma, by time-averaging, the time period required for rematching the impedance of the coil 104 using the impedance-matching network 306 can be relatively long such that good matching may be difficult to maintain in certain circumstances. During the rematching time period, the RF power to the plasma may be effectively shut off due to RF power reflection caused by the impedances of the coil 104 and the blocking capacitor not being sufficiently well-matched to that of the generator. Also, the time needed for rematching may be too long for relatively short deposition processes such as those lasting only tens of seconds.

In the embodiment of FIG. 4, by keeping the sum of the tunable inductances ($L_{tune1}+L_{tune2}$) substantially constant, a change in the blocking impedance of the blocking circuit 321 (by varying the inductance of the tunable inductor 320) to rotate the voltage distribution along the coil does not cause the circuit to lose its match to the generator. Consequently, the embodiment of FIG. 4 is well suited to those applications which require the maintenance of a good impedance match to prevent undue reflection of the RF energy from the generator. Thus, the embodiment of FIG. 4 may readily utilize impedance-matching maintenance by frequency auto-tuning or mechanical auto-tuning as well as for any other known matching techniques.

Figure 5:
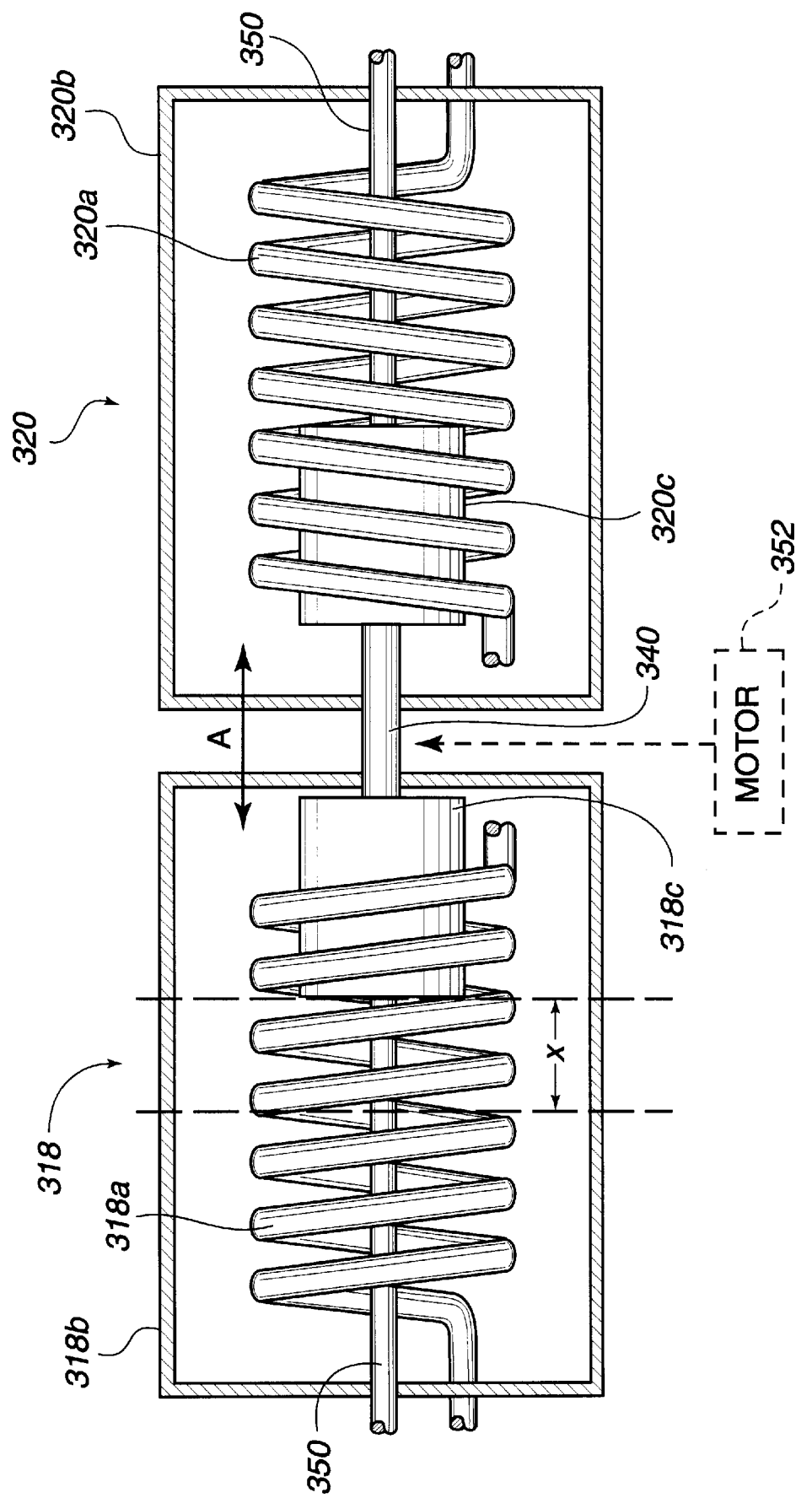
FIG. 5 is a partial cross-sectional schematic view of a pair of tunable inductors in accordance with an embodiment of the present invention.

The sum of tunable impedances such as the inductances ($L_{tune1}+L_{tune2}$) of the inductors 318 and 320 may be kept substantially constant in a variety of different arrangements. For example, FIG. 5 illustrates an embodiment having two tunable inductors 318 and 320 in which the sum of the associated tunable inductances ($L_{tune1}+L_{tune2}$) remains substantially constant by mechanically coupling the two tunable inductors 318 and 320 together. As shown in FIG. 5, two substantially identical coils 318a and 320a are placed head-to-head in two substantially identical metal boxes 318b and 320b. Two substantially identical core pieces 318c and 320c, having openings along their respective substantially colinear axes, are disposed inside the coils 318a and 320a, respectively, and are connected by a substantially rigid, hollow and substantially electrically insulating connector 340. A rigid and electrically insulating guiding rod 350 is disposed along the centers of the metal boxes 318b and 320b and the axes of the coils 318a and 320a, and passes through the central openings of the hollow core pieces 318c and 320c and through the hollow connector 340. The guiding rod 350 is firmly attached to the metal boxes 318b and 320b. The core pieces 318c and 320c and the connector 340 are adapted to slide along the guiding rod 350, such that the guiding rod 350 mechanically guides the movement of the core pieces 318c and 320c and the connector 340. Because the core pieces 318c and 320c are mechanically linked together by the connector 340, core pieces 318c and 320c move in unison in and out of their respective coils 318a and 320a, as indicated by the arrow A in FIG. 5. This coupled movement of the core pieces 318c and 320c substantially tunes the respective inductances $L_{tune1}$ and $L_{tune2}$ of the series tunable inductors 318 and 320 substantially simultaneously.

The core pieces 318c and 320c may be made of a variety of materials including ferromagnetic materials such as soft magnetic core materials or other materials such as stainless steel. Thus, if core piece 318c is made of stainless steel 1010, for example, the permeability property of the core piece 318c augments or increases the inductance $L_{tune1}$ of coil 318a. This increase is at a maximum when core piece 318c is disposed substantially at the center of coil 318a. The distance between the center of coil 318a and the edge of core piece 318c closest to the center of coil 318a is represented by "x" in FIG. 5. As the distance x decreases, the inductance $L_{tune1}$ of coil 318a increases. Conversely, as the distance x increases, the inductance $L_{tune1}$ of coil 318a decreases.

Figure 6:
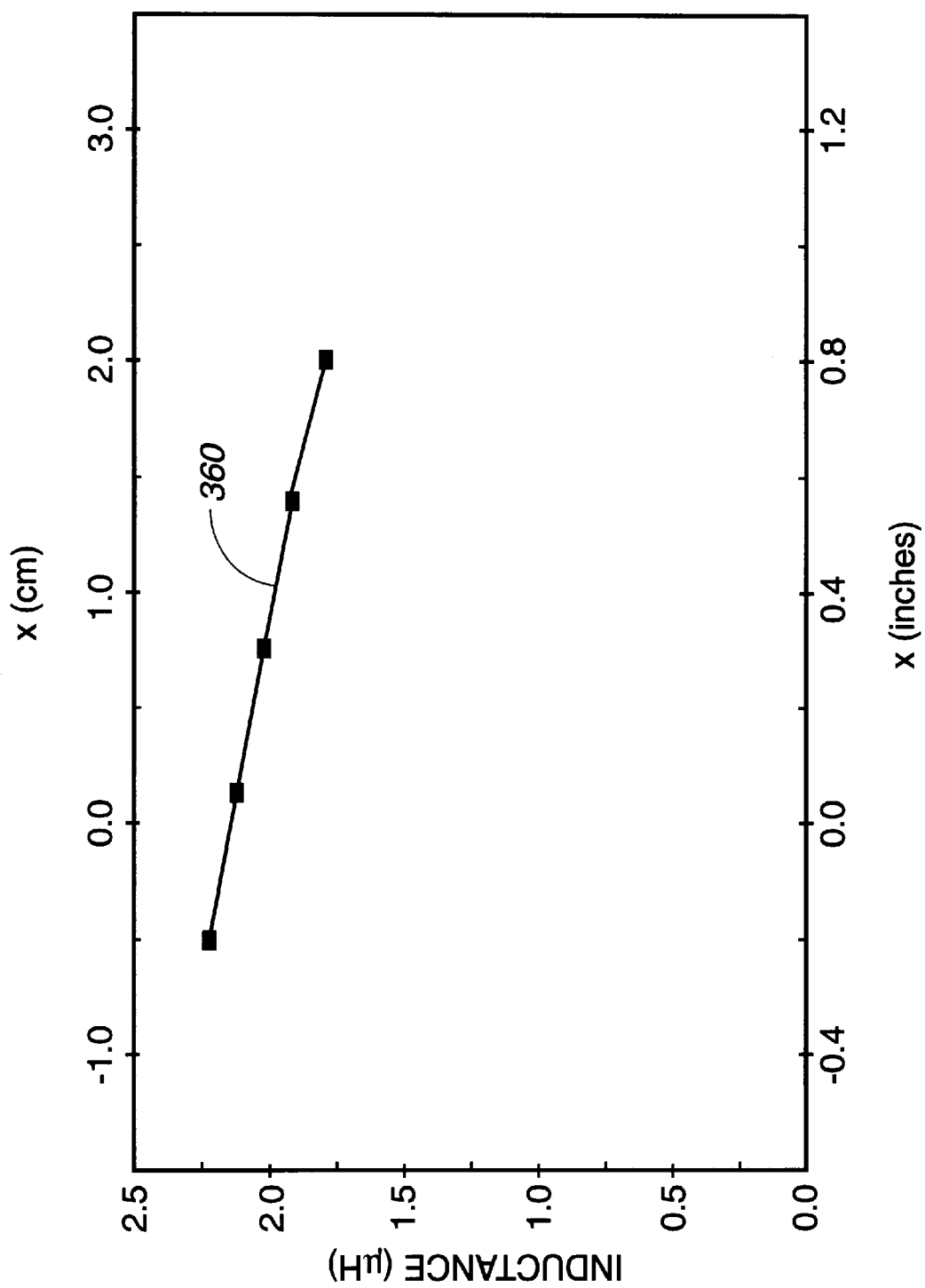
FIG. 6 is a graph illustrating results of calculations of induction values in accordance with the embodiment of FIG. 5.

FIG. 6 is a graph illustrating results of calculations made based upon using a stainless steel 1010 core piece 318c. As shown therein, the change in the inductance $L_{tune1}$ of coil 318a as a function of the distance x is calculated to be substantially linear over a certain domain of the displacement x from about x=−0.2 in (−0.5 cm) to about x=0.8 in (2.0 cm), as shown by the interpolating graph 360. The vertical scale in FIG. 6 is measured in microHenrys ($\mu$H). It is believed that the total change in the inductance $L_{tune1}$ of coil 318a shown in FIG. 6, of about 0.5 $\mu$H (which in the illustrated embodiment is about 25%), is sufficient for many applications to rotate the RF voltage distributions along the one turn coil 104, and to rotate ionization pattern associated with the RF voltage distribution. However, it is also believed that the entire range of linear change in the inductance $L_{tune1}$ of coil 318a with distance x is larger than shown in FIG. 6. Thus, the available range of substantially linear change in inductors may be relatively large for those applications which require a large change during deposition. The amount of impedance change required to rotate the voltage distribution will depend upon a number of factors including the number of turns of the sputtering coil 104 and in some applications the diameter of the coil 104.

It is contemplated that impedance changes having a lower maximum change may be used to achieve beneficial RF voltage and plasma ionization rotations or other movements. For example, an impedance change which varies between 0 and 0.1 $\mu$H may provide beneficial shifts. On the other hand, impedance changes having a maximum change substantially greater than 0.5 $\mu$Henries, including 1.5 $\mu$H and more may also be beneficial to improve uniformity. Also, it is believed that a variable impedance such as an inductor having an oscillating core which changes the inductor impedance a maximum of 0.5 $\mu$H as described above is sufficient to shift the voltage distribution a full 360° around the circumference of the coil each half cycle of the core movement. Voltage distribution shifts over smaller portions of the coil circumference such as 270°, 180°, 90° 45°, 30°, 15° and smaller may also be beneficial. Likewise, voltage distribution shifts on multi-turn coils which lap the coil circumference in whole or in part shifting the voltage distribution around more than one turn each cycle or half cycle of the impedance change are also believed to be beneficial. Thus, for example, movement of an inductor core from one end to the other of the core's travel path may cause the voltage distribution to shift around a plurality of turns and hence around the circumference of the coil several times. Accordingly, the voltage distribution may shift an angular distance which is in excess of 360° each half cycle of the core's movement.

As set forth above, the core pieces 318c and 320c are coupled together by the connector 340 and the guiding rod 350. As a result, an increase in the distance x between the center of coil 318a and the edge of core piece 318c closest to the center of coil 318a, as shown in FIG. 5, causes a corresponding decrease in the distance between the center of coil 320a and the edge of core piece 320c closest to the center of coil 320a, also as shown in FIG. 5. In the linear regime, the inductances $L_{tune1}$ and $L_{tune2}$ of the coils 318a and 320a, respectively, change substantially linearly, and substantially oppositely, with changes in the distance between the centers of coils 318a and 320a and the edges of respective core pieces 318c and 320c closest to the centers of coils 318a and 320a. Thus, an increase in the inductance $L_{tune1}$ of the coil 318a can be substantially compensated by a corresponding substantially equal decrease in the inductance $L_{tune2}$ of the coil 320a. Conversely, a decrease in the inductance $L_{tune1}$ of the coil 318a is substantially compensated by a corresponding substantially equal increase in the inductance $L_{tune2}$ of the coil 320a. The sum of the tunable inductances ($L_{tune1}+L_{tune2}$) thus remains substantially constant by coupling the two series tunable inductors 318 and 320 together as shown in FIG. 5. It is believed that no rematching of the impedance of the coil 104 with the RF generator 300 is needed, even though the individual inductances $L_{tune1}$ and $L_{tune2}$ of the coils 318a and 320a each change, since the sum of the tunable inductances ($L_{tune1}+L_{tune2}$) thus remains substantially constant as set forth above.

Thus, by cyclicly shifting the coupled core pieces 318c and 320c back and forth within their respective coils 318a and 320b, the inductances of the inductors 318 and 320 may be continuously and cyclicly varied in such a manner as to shift the coil voltage distributions through all or substantially all points along the circumference of the coil 104 in repeating cycles as the deposition progresses. Moreover, because the sum of the inductances of the coils 318 and 320 remain substantially constant as the individual inductances of the coils 318 and 320 are varied, it is believed that the need for impedance rematching as a consequence of the impedance variation is substantially obviated. The core pieces 318c and 320c may be actuated by a motor 352 or any other suitable actuator.

Alternatively, the core pieces 318c and 320c may be made of a nonferromagnetic, preferably a highly conductive material such as aluminum or copper. Core piece 318*c* made of copper, for example, dampens or decreases the inductance $L_{tune1}$ of coil 318*a*. This decrease is at a maximum when core piece 318*c* is disposed substantially at the center of coil 318*a*. Thus, where the distance x represents the distance between the center of coil 318*a* and the edge of core piece 318*c* closest to the center of coil 318*a*, as shown in FIG. 5, as the distance x decreases, the inductance $L_{tune1}$ of coil 318*a* decreases. Conversely, as the distance x increases, the inductance $L_{tune1}$ of coil 318*a* increases. Again, an increase in the inductance $L_{tune1}$ of the coil 318*a* can be substantially exactly compensated by a corresponding decrease in the inductance $L_{tune2}$ of the coil 320*a*. Conversely, a decrease in the inductance $L_{tune1}$ of the coil 318*a* can be again substantially compensated by a corresponding equal increase in the inductance $L_{tune2}$ of the coil 320*a*. The sum of the tunable inductances ($L_{tune1}+L_{tune2}$) thus again remains substantially constant by coupling the two series tunable inductors 318 and 320 together as shown in FIG. 5. Less conductive materials such as zinc may also be used but is believed that such materials are less effective.

Because the guiding rod 350 is disposed substantially inside the coils 318*a* and 320*a* which can generate substantial heat, the guiding rod 350 may be made heat resistant, by forming the rod of a heat resistant material such as a ceramic, for example. The guiding rod 350 may also be water cooled. For the connector 340, disposed substantially outside of the coils 318*a* and 320*a*, and between the coils 318*a* and 320*a*, heat resistance is less of a concern.

Figure 7:
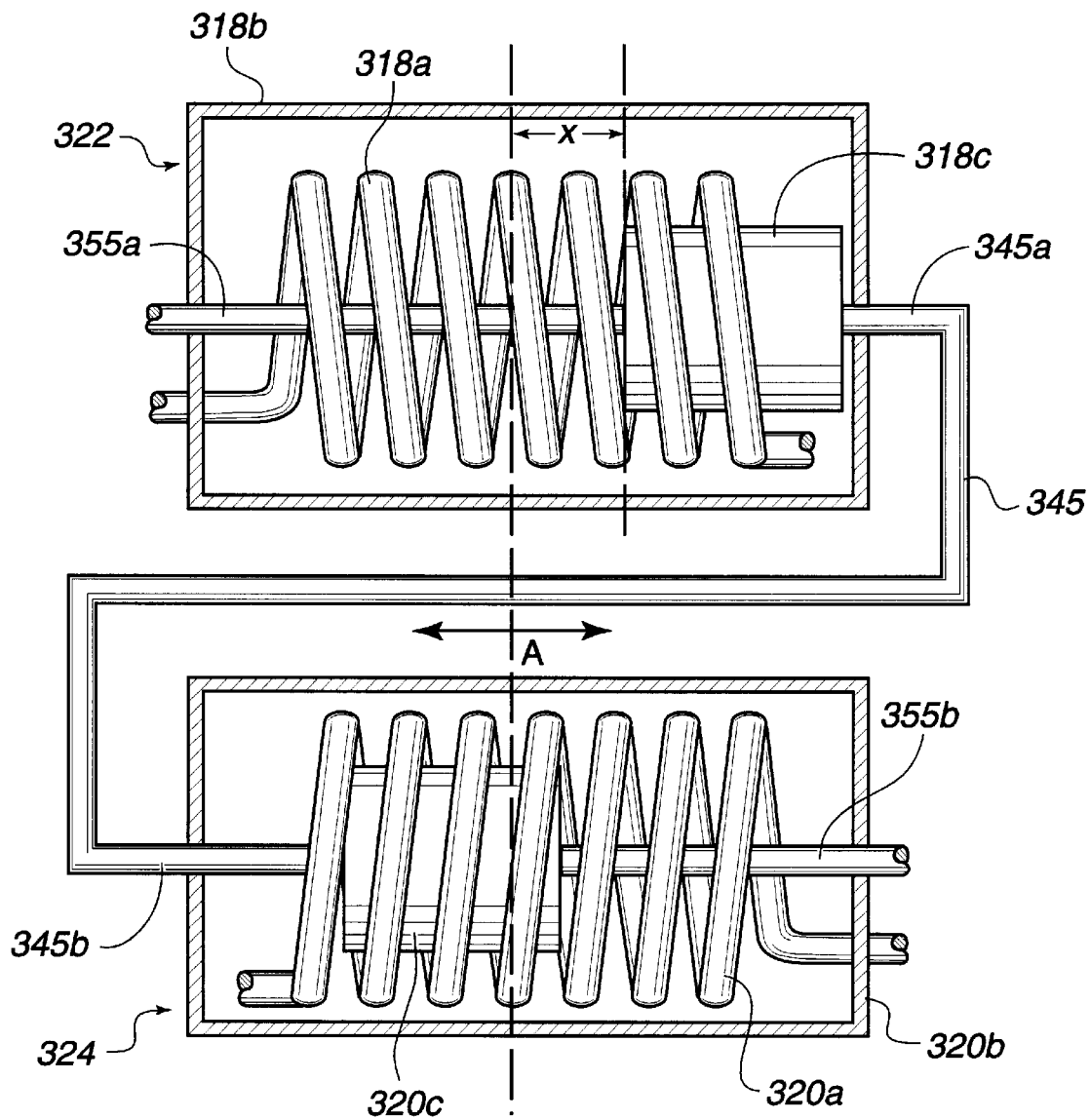
FIG. 7 is a partial cross-sectional schematic view of a pair of tunable inductors in accordance with another embodiment of the present invention.

FIG. 7 illustrates another embodiment having two series tunable inductors 322 and 324 that may be tuned substantially simultaneously so that the sum of the tunable inductances ($L_{tune1}+L_{tune2}$) remains substantially constant by coupling the two series tunable inductors 322 and 324 together. As shown in FIG. 7, rather than being placed so as to be coaxial, two substantially identical coils 318*a* and 320*a* are placed side-by-side in two substantially identical metal boxes 318*b* and 320*b*. Two substantially identical core pieces 318*c* and 320*c*, having openings along their respective substantially parallel axes, are disposed inside the coils 318*a* and 320*a*, respectively, and are connected by a substantially rigid, hollow and electrically insulating "S"-shaped connector 345. A pair of parallel, rigid and electrically insulating guiding rods 355*a* and 355*b* are disposed along the centers of the metal boxes 318*b* and 320*b* and the axes of the coils 318*a* and 320*a*, and pass through the axes of the hollow core pieces 318*c* and 320*c* and into the coaxial ends 345*a* and 345*b* of the hollow connector 345. The guiding rods 355*a* and 355*b* are firmly attached to the metal boxes 318*b* and 320*b*. The core pieces 318*c* and 320*c* and the connector 345 can slide along the guiding rods 355*a* and 355*b* so that the guiding rods mechanically guide the movement of the core pieces 318*c* and 320*c* and the connector 345. This movement of the core pieces 318*c* and 320*c* in and out of the coils 318*a* and 320*a*, as indicated by the arrow A in FIG. 7, substantially simultaneously tunes the respective inductances $L_{tune1}$ and $L_{tune2}$ of the series tunable inductors 318 and 320.

Again, the distance x is the distance between the center of coil 318*a* and the edge of core piece 318*c* closest to the center of coil 318*a*, as shown in FIG. 7. As the distance x decreases, the inductance $L_{tune1}$ of coil 318*a* decreases. Conversely, as the distance x increases, the inductance $L_{tune1}$ of coil 318*a* increases. Again, an increase in the inductance $L_{tune1}$ of the coil 318*a* is substantially compensated by a corresponding decrease in the inductance $L_{tune2}$ of the coil 320*a*. Conversely, a decrease in the inductance $L_{tune1}$ of the coil 318*a* is again substantially compensated by a corresponding increase in the inductance $L_{tune2}$ of the coil 320*a*. The sum of the tunable inductances ($L_{tune1}+L_{tune2}$) thus again remains substantially constant by coupling the two series tunable inductors 318 and 320 together as shown in FIG. 7.

Figure 8:
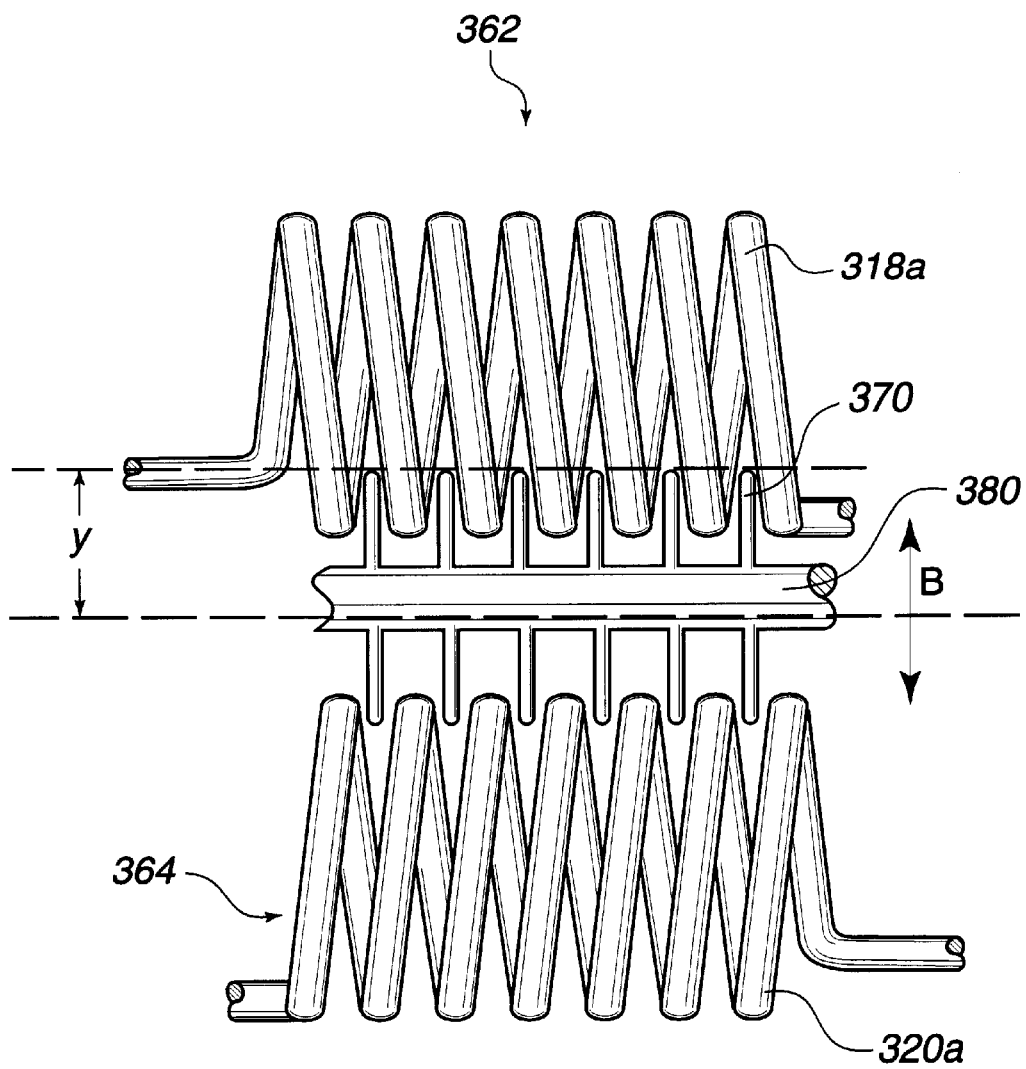
FIG. 8 is a partial cross-sectional schematic view of a pair of tunable inductor coils in accordance with yet another embodiment of the present invention.

FIG. 8 illustrates another embodiment having two series tunable inductors 362 and 364 that may be tuned substantially simultaneously so that the sum of the tunable inductances ($L_{tune1}+L_{tune2}$) remains substantially constant by coupling the two series tunable inductors 362 and 364 together. As shown in FIG. 8, two substantially identical coils 318*a* and 320*a* are placed side-by-side, with blades 370 protruding from a support rod 380 interleaved between the turns of the coils 318*a* and 320*a*. The blades 370 and the support rod 380 may be moved vertically up and down, as indicated by the arrow B in FIG. 8, and may thereby substantially simultaneously tune the respective inductances $L_{tune1}$ and $L_{tune2}$ of the series tunable inductors 362 and 364.

The distance y is the distance between the central axis between coil 318*a* and coil 320*a* and the edge of the blades 370 closest to the central axis of coil 318*a*, as shown in FIG. 8. As the distance y increases, it is believed that the inductance $L_{tune1}$ of coil 318*a* increases when the blades 370 are made of a ferromagnetic material. Conversely, as the distance y decreases, the inductance $L_{tune1}$ of coil 318*a* decreases when the blades 370 are made of a ferromagnetic material.

Alternatively, as the distance y increases, it is believed that the inductance $L_{tune1}$ of coil 318*a* decreases when the blades 370 are made of a nonferromagnetic material. Conversely, as the distance y decreases, the inductance $L_{tune1}$ of coil 318*a* increases when the blades 370 are made of a nonferromagnetic material.

Again, an increase in the inductance $L_{tune1}$ of the coil 318*a* is substantially compensated by a corresponding decrease in the inductance $L_{tune2}$ of the coil 320*a*. Conversely, a decrease in the inductance $L_{tune1}$ of the coil 318*a* is again substantially compensated by a corresponding increase in the inductance $L_{tune2}$ of the coil 320*a*. The sum of the tunable inductances ($L_{tune1}+L_{tune2}$) thus again remains substantially constant by coupling the two series tunable inductors 318 and 320 together as shown in FIG. 8.

In each of the embodiments shown in FIGS. 5, 7 and 8, the movements as indicated by the arrows A and B are substantially linear. Other movements including nonlinear and rotary movements may also be used. However, it is preferred that the movement in coil 318*a* be substantially compensated by a corresponding movement in coil 320*a*, for example, by suitably coupling the two series tunable inductors 318 and 320 together.

Figure 9:
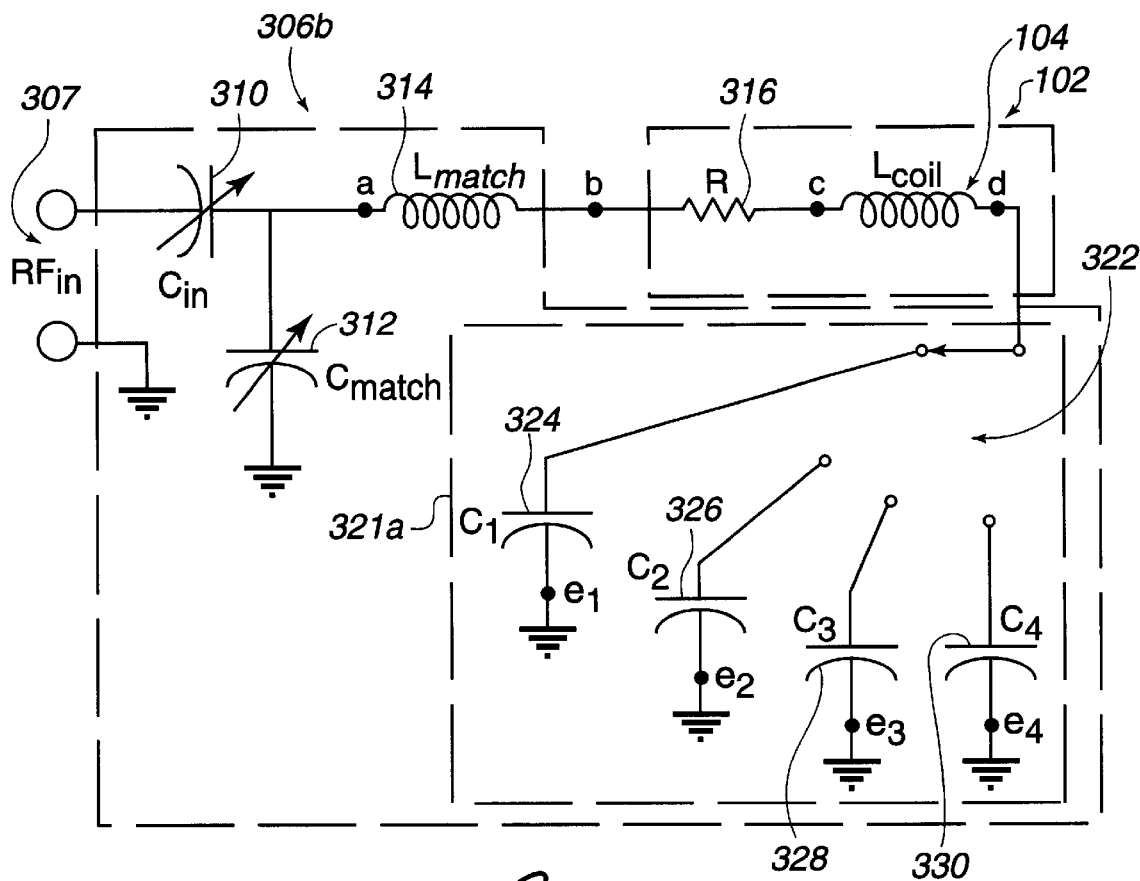
FIG. 9 is a schematic diagram according to yet another embodiment of the impedance-matching network and the plasma generating chamber of FIG. 2.

FIG. 9 schematically shows yet another embodiment of an impedance-matching network 306*b* which is described 4p eater detail in copending application Ser. No. 08/857,921 filed may 16, 1992, entitled "Use of Variable Impedance to Control Coil Sputter Distribution" by Jim Van Gogh and John Forster (Attorney Docket No. 1737/PVD/DV) and assigned to the assignee of the present application, which application is incorporated herein by reference in its entirety. The network 306*b* is similar to the impedance-matching network 306 of FIG. 3 except that a block impedance 321*a* is provided by a set of blocking capacitors 324, 326, 328 and 330 with discrete capacitances $C_1$, $C_2$, $C_3$ and $C_4$, respectively. Each capacitor may be selectively coupled to the coil through switch 322.

Here, too, when the coil 104 is biased by a substantially constant DC offset bias, or a DC self-bias, $V_{bias}$, the discrete capacitance values of the switchable set of blocking capacitors 324, 326, 328 and 330 may be cyclicly selected using the switch 322 so that the effective potential V may be made to equal the substantially constant DC offset bias or the DC self-bias (V=$V_{bias}$) at a corresponding number of spaced points along the coil 104 between point c and point d in repeating cycles. The number and spacing of these points along the coil is determined by the number of capacitors and their respective capacitive values. This ability to vary over time the points along the coil 104 at which the effective potential V equals the substantially constant DC offset bias or the DC self-bias (V=$V_{bias}$) may also be used to shift the RF voltage distributions to these discrete points along the coil 104, and to shift the ionization pattern of the plasma. As a consequence, the coil 104 and substrate 112 are more uniformly and axially symmetrically heated, and the material sputtered from the target 110 may be more uniformly deposited, by time-averaging, on the substrate 112. The switch 322 for selecting the capacitors may be a mechanical, electromechanical, or electronic switch. The capacitors may be selected in a sequential manner to shift the voltage distribution to four points in sequence along the coil 104 in repeating cycles as the deposition progresses. If the capacitor values are selected in order of increasing (or decreasing) capacitive value, the coil voltage distribution will be rotated as each capacitor is selected in turn. Alternatively, the capacitors may be selected in various orders or sequences in each cycle including random and pseudo-random sequences to shift the voltage distribution around the coil to achieve the desired coil heating or coil sputtering pattern on the coil 104. It is further contemplated that discrete inductors may be substituted for or used in combination with the switched discrete capacitors.

Figure 10:
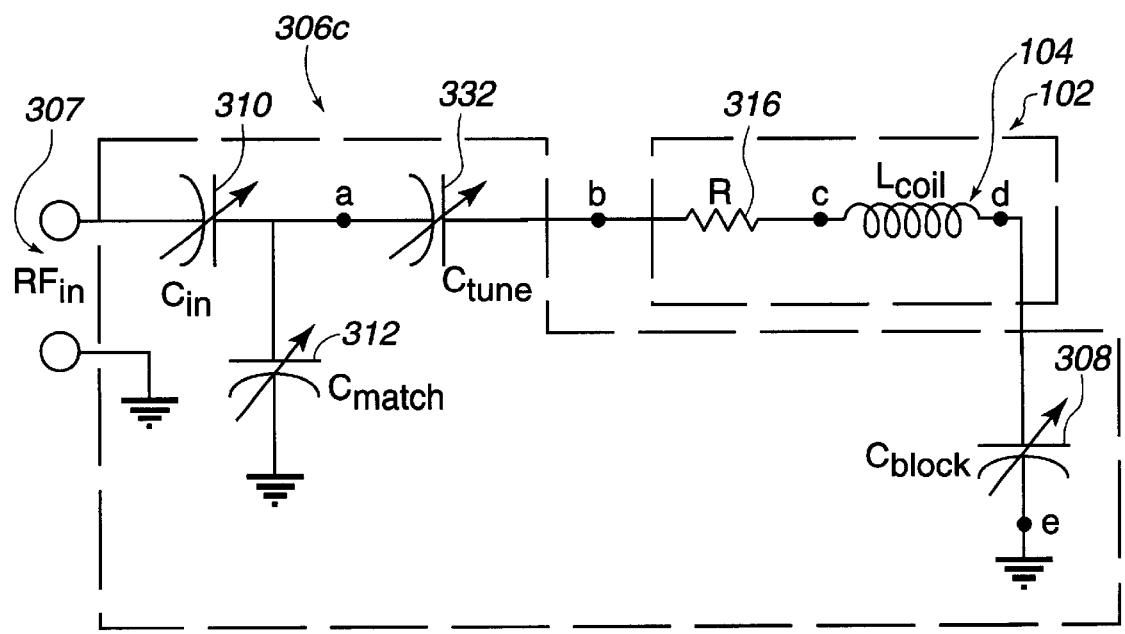
FIG. 10 is a schematic diagram according to still yet another embodiment of the impedance-matching network and the plasma generating chamber of FIG. 2.

FIG. 10 schematically shows still another embodiment of an impedance-matching network 306c which is similar to the impedance-matching network 306 of FIG. 3 except that a series variable capacitor 332 with variable capacitance Ctune is provided instead of the series match inductor 314 with inductance Lmatch. Here, again, when the coil 104 is biased by a substantially constant DC offset bias, or a DC self-bias, $V_{bias}$, the variable capacitance $C_{block}$ of the variable blocking capacitor 308 may be chosen so that the effective potential V may be made to equal the substantially constant DC offset bias or the DC self-bias (V=$V_{bias}$) at any point along the coil 104 between point c and point d, thereby rotating the RF voltage distributions along the coil 104, and rotating the plasma ionization pattern, so that the coil 104 is more uniformly and axially symmetrically heated and sputtered, and the material sputtered from the target 110 is more uniformly deposited, by time-averaging, on the substrate 112. In addition, the two series variable capacitors 332 and 308 may be tuned substantially simultaneously so that the sum of the variable capacitive reactances ($\omega C_{tune}$)$^{-1}$+($\omega C_{block}$)$^{-1}$ remains substantially constant by coupling the two series variable capacitors 332 and 308 together so that an increase in the capacitance of one capacitor is compensated by an appropriate decrease in the capacitance of the other, and vice versa. This may be achieved, for example, by mechanically moving the plates of the capacitors so as to change the respective spacings between the capacitor plates in tandem, or moving dielectrics between the plates in tandem, or both.

As a consequence, the need for rematching the impedance of the coil 104 using the impedance-matching network 306c once a good match has been made between the coil 104 and the RF generator 300 (FIG. 2) can be reduced or eliminated.

Figure 11:
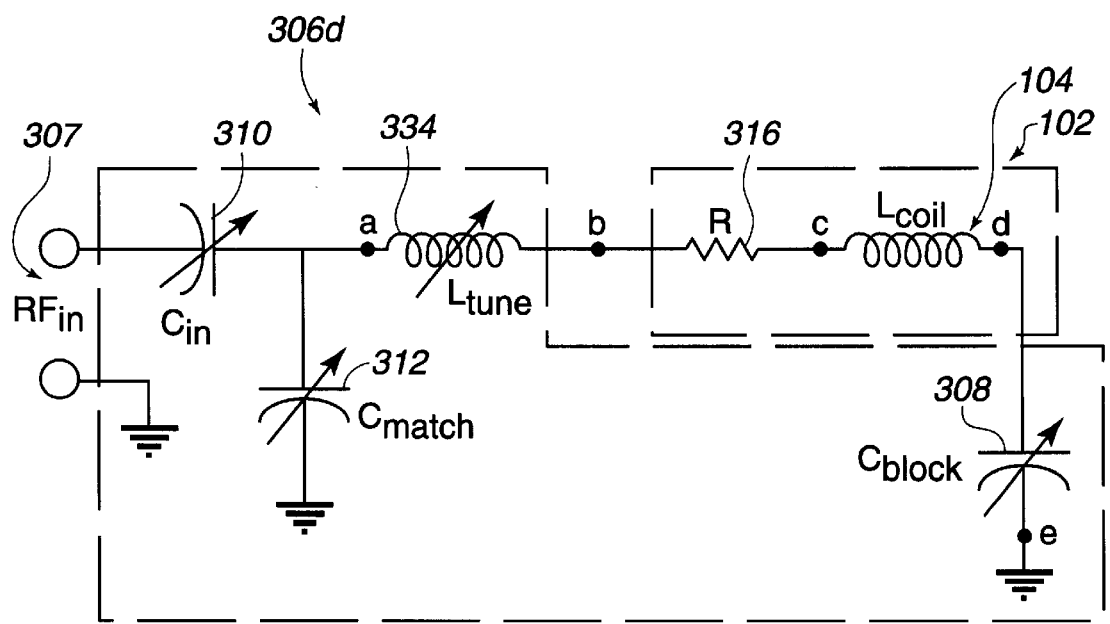
FIG. 11 is a schematic diagram according to yet still another embodiment of the impedance-matching network and the plasma generating chamber of FIG. 2.

FIG. 11 schematically shows still yet another embodiment of an impedance-matching network 306d which is similar to the impedance-matching network 306c of FIG. 3 except that a series tunable inductor 334 with tunable inductance $L_{tune}$ is provided instead of the series variable capacitor 332 with variable capacitance $C_{tune}$. In this embodiment, keeping the difference between the tunable inductive reactance and the variable capacitive reactance $\omega L_{tune}$-($\omega C_{block}$)$^{-1}$ substantially constant, by coupling the series tunable inductor 334 and the variable capacitor 308 together, advantageously eliminates the need for rematching the impedance of the coil 104 using the impedance-matching network 306d once a good match has been made between the coil 104 and the RF generator 300 (FIG. 2).

Figure 12:
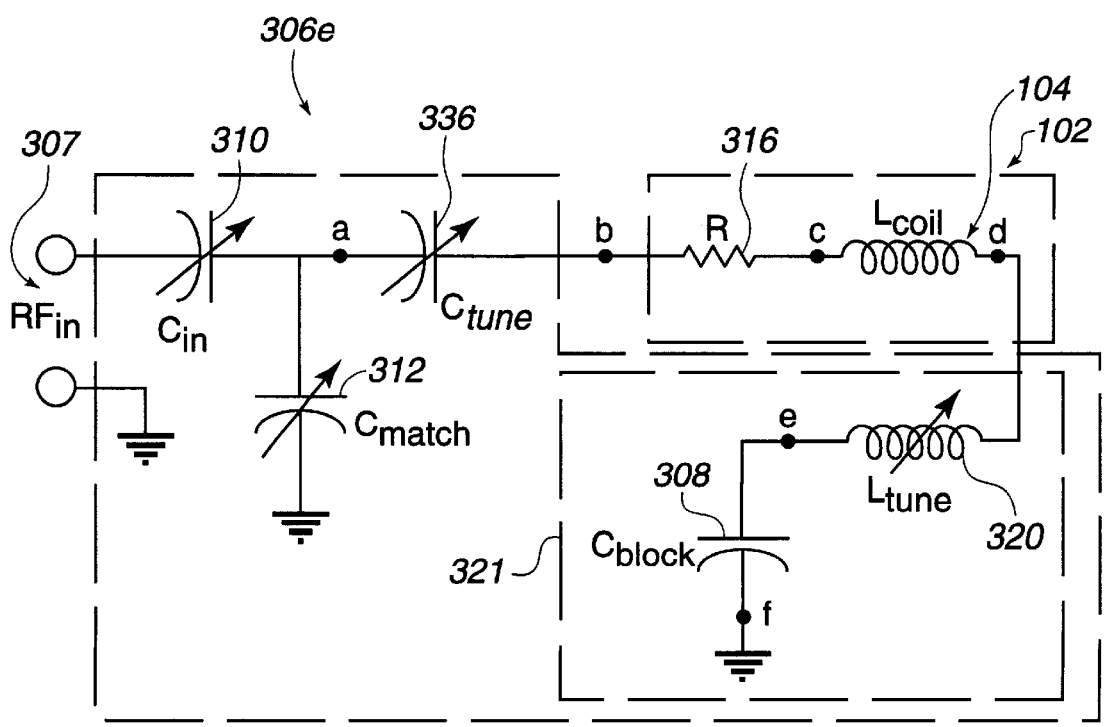
FIG. 12 is a schematic diagram according to one more embodiment of the impedance-matching network and the plasma generating chamber of FIG. 2.

FIG. 12 schematically shows another embodiment of an impedance-matching network 306e which is similar to the impedance-matching network 306a of FIG. 4 except that a series variable capacitor 336 with variable capacitance $C_{tune}$ is provided instead of the series tunable inductor 318 with tunable inductance $L_{tune1}$ and the series tunable inductor 320 has tunable inductance $L_{tune}$ instead of $L_{tune2}$. In this embodiment, again keeping the difference between the tunable inductive reactance and the variable capacitive reactance $\omega L_{tune}$-($\omega C_{tune}$)$^{-1}$ substantially constant, by coupling the series tunable inductor 320 and the variable capacitor 336 together, advantageously eliminates the need for rematching the impedance of the coil 104 using the impedance-matching network 306e once a good match has been made between the coil 104 and the RF generator 300 (FIG. 2).

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

RF power is applied to the coil 104 by feedthrough bolts which are supported by insulating feedthrough standoffs 124. The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, has an internal labyrinth structure to prevent the formation of a short between the coil 104 and the wall 126 of the shield. The feedthrough is coupled to the RF generator 300 (shown schematically in FIG. 2) through the impedance-matching network 306 (also shown schematically in FIG. 2).

As set forth above, the RF power radiated by the coil 104 energizes the plasma in the chamber to ionize the target material being sputtered from the target 110. The ionized sputtered target material is in turn attracted to the substrate 112 which is at a negative (DC or RF) potential to attract the ionized deposition material to the substrate 112.

In the illustrated embodiments discussed above, a single turn coil 104 was used, but, of course, multiple turn coils may be used instead. Still further, instead of the ribbon shape coil 104 illustrated, each turn of the coil 104 may be implemented with water cooled tubular helix or spiral shaped coils. Also, a flat, open-ended annular ring may be used as described in copending application Ser. No. 08/680, 335, entitled "Coils for Generating a Plasma and for Sputtering," filed Jul. 10, 1996 (Attorney Docket No. 1390-

CIP/PVD/DV) and assigned to the assignee of the present application, which application is incorporated herein by reference in its entirety.

Each of the embodiments discussed above utilized a single coil in the plasma chamber. It should be recognized that the present invention is applicable to plasma chambers having more than one RF powered coil or RF powered shields. For example, the present invention may be applied to multiple coil chambers for launching helicon waves of the type described in aforementioned copending application Ser. No. 08/559,345, filed Nov. 15, 1995 and entitled "Method And Apparatus For Launching a Helicon Wave in a Plasma" (Attorney Docket No. 938).

The appropriate RF generators and matching circuits have components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary. For example, 1 MHz to 20 MHz is believed suitable. An RF power setting of 1.5 kW is preferred but a range of 1.5–5 kW is satisfactory. In addition, a DC power setting for biasing the target 110 of 8–12 kW is preferred but a wider range such as 2–24 kW may also be satisfactory. A pedestal 114 bias voltage of −30 volts DC is also suitable. Values for the above parameters will vary, depending upon the particular application.

A variety of sputtering gases may be utilized to generate the plasma including Ar, and a variety of reactive gases such as $NF_3$, $CF_4$, $H_2$, $O_2$ and many others may be used. Various sputtering gas pressures are suitable including pressures of 0.1–100 mTorr. For ionized PVD, a pressure between 10 and 50 mTorr often provides better ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A semiconductor fabrication system for sputtering material onto a substrate, the system comprising:
    a semiconductor fabrication chamber having a plasma generation area within said chamber;
    said chamber having a target of said material for sputtering;
    a coil positioned to couple energy into said plasma generation area; and
    an impedance-matching box coupled to said coil, said impedance-matching box having a continuously tunable variable reactance adapted to shift voltage distributions in a predetermined continuous path along said coil to thereby time-average said voltage distributions along said coil.

2. The system of claim 1 wherein said tunable variable reactance includes a tunable inductor.

3. The system of claim 1 wherein said tunable variable reactance includes first and second tunable inductors.

4. The system of claim 3 wherein said tunable variable reactance includes a core piece movably disposed within said first and second tunable inductors.

5. The system of claim 4 wherein said core piece compensates a first change in a first inductive reactance of said first tunable inductor with a second change in a second inductive reactance of said second tunable inductor so as to keep a sum of said first and second inductive reactances substantially constant.

6. The system of claim 5 wherein said first and second tunable inductors are substantially identical.

7. The system of claim 4 wherein said first and second tunable inductors are substantially identical.

8. The system of claim 4 wherein said core piece is substantially ferromagnetic.

9. The system of claim 4 wherein said core piece is substantially nonferromagnetic.

10. The system of claim 3 wherein said first and second tunable inductors are substantially identical.

11. The system of claim 1 wherein said tunable variable reactance includes a variable capacitor.

12. The system of claim 1 wherein said tunable variable reactance includes first and second variable capacitors.

13. The system of claim 12 wherein said tunable variable reactance includes a dielectric piece movably disposed within said first and second variable capacitors.

14. The system of claim 13 wherein said dielectric piece compensates a first change in a first capacitive reactance of said first variable capacitor with a second change in a second capacitive reactance of said second variable capacitor so as to keep a sum of said first and second capacitive reactances substantially constant.

15. The system of claim 14 wherein said first and second variable capacitors are substantially identical.

16. The system of claim 12 wherein said first and second variable capacitors are substantially identical.

17. The system of claim 13 wherein said first and second variable capacitors are substantially identical.

18. The system of claim 1 wherein said tunable variable reactance includes a first inductor having a first movable core, and a second inductor having a second movable core mechanically linked to said first core.

19. The system of claim 1 wherein said tunable variable reactance includes a substantially continuously variable capacitor.

20. The system of claim 1 wherein said tunable variable reactance includes a variable capacitor and a tunable inductor.

21. The system of claim 1 wherein said coil is carried by said chamber.

22. The system of claim 1 wherein said coil is positioned within said chamber.

23. A semiconductor fabrication system, comprising:
    a semiconductor fabrication chamber having a plasma generation area within said chamber;
    a coil positioned to couple energy into said plasma generation area to maintain a plasma in said plasma generation area, said coil having a plurality of voltage values distributed along said coil; and
    means for shifting said distribution of voltage values in a predetermined continuous path along said coil.

24. The system of claim 23 wherein said shifting means cyclicly shifts said voltage distribution along said coil.

25. The system of claim 23 wherein said shifting means comprises a first continuously variable inductor coupled between said coil and ground.

26. The system of claim 25 wherein said shifting means comprises an RF generator and a second continuously variable inductor coupled between said generator and said coil.

27. The system of claim 26 wherein said first inductor has a first movable core and said second inductor has a second movable core.

28. The system of claim 27 wherein said first movable core is mechanically linked to said second movable core so that movement of said second movable core is responsive to movement of said first movable core.

29. The system of claim 28 wherein said shifting means further comprises a motor for cyclicly moving said first and second movable cores back and forth in unison.

30. The system of claim 27 wherein said first movable core is mechanically linked to said second movable core so that the sum of the inductances of said first and second inductors remains substantially constant during movement of said first and second movable cores.

31. A semiconductor fabrication system, comprising:
a semiconductor fabrication chamber having a plasma generation area within said chamber;
a coil positioned to couple energy into said plasma generation area to maintain a plasma in said plasma generation area, said coil having a plurality of voltage values distributed along said coil;
a first inductor coupled between said coil and ground; and
means for changing the inductance of said first inductor so as to shift voltage distributions in a predetermined continuous oath along said coil.

32. The system of claim 31 wherein said first inductor has a first movable core and said changing means comprises means for moving said first core within said first inductor.

33. The system of claim 32 further comprising an RF generator coupled to said coil and a second inductor coupled between said generator and said coil.

34. The system of claim 33 wherein said second inductor has a second movable core and said changing means comprises means for moving said second core within said second inductor.

35. The system of claim 34 wherein changing means comprises means for moving said first core within said first inductor simultaneously with moving said second core within said second inductor.

36. The system of claim 34 wherein said changing means moves said first core within said first inductor and moves said second core within said second inductor so that the inductances of said first and second inductances are changed complementary one to the other.

37. The system of claim 34 wherein said changing means moves said first core within said first inductor and moves said second core within said second inductor so that the sum of the inductances of said first and second inductors remains substantially constant.

38. The system of claim 34 wherein said changing means includes a link mechanically linking said first and second cores so that said first and second cores move in unison.

39. A semiconductor fabrication system for use with an RF generator, comprising:
a semiconductor fabrication chamber having a plasma generation area within said chamber;
a coil carried by said chamber and positioned to couple energy into said plasma generation area to maintain a plasma in said plasma generation area, said coil having a first end and a second end wherein said first end is adapted to be coupled to said RF generator;
a first variable inductor coupled between said coil second end and ground, said first inductor having a first core adapted to move within said first inductor; and
a second variable inductor adapted to be coupled between said coil first end and said RF generator, said second inductor having a second core adapted to move within said second inductor, said second core being mechanically coupled to said first core so that said first and second cores move in unison.

40. A semiconductor fabrication process for sputtering material onto a substrate, the process comprising:
energizing a coil of a semiconductor fabrication chamber having a plasma generation area within said chamber, said chamber having a target of said material for sputtering, said coil positioned to couple energy into said plasma generation area to ionize said sputtered target material to form a layer of said sputtered target material on said substrate; and
time-averaging voltage distributions along said coil by shifting said voltage distributions in a predetermined continuous path along said coil using an impedance-matching box connected to said coil, said impedance-matching box having a continuously tunable variable reactance.

41. The process of claim 40 wherein said tunable variable reactance includes a tunable inductor.

42. The process of claim 40 wherein said tunable variable reactance includes first and second tunable inductors.

43. The process of claim 42 wherein said tunable variable reactance includes a core piece movably disposed within said first and second tunable inductors.

44. The process of claim 43 wherein said core piece compensates a first change in a first inductive reactance of said first tunable inductor with a second change in a second inductive reactance of said second tunable inductor so as to keep a sum of said first and second inductive reactances substantially constant.

45. The process of claim 44 wherein said first and second tunable inductors are substantially identical.

46. The process of claim 43 wherein said first and second tunable inductors are substantially identical.

47. The process of claim 43 wherein said core piece is substantially ferromagnetic.

48. The process of claim 43 wherein said core piece is substantially nonferromagnetic.

49. The process of claim 42 wherein said first and second tunable inductors are substantially identical.

50. The process of claim 40 wherein said tunable variable reactance includes a variable capacitor.

51. The process of claim 40 wherein said tunable variable reactance includes first and second variable capacitors.

52. The process of claim 51 wherein said tunable variable reactance includes a dielectric piece movably disposed within said first and second variable capacitors.

53. The process of claim 52 wherein said dielectric piece compensates a first change in a first capacitive reactance of said first variable capacitor with a second change in a second capacitive reactance of said second variable capacitor so as to keep a sum of said first and second capacitive reactances substantially constant.

54. The process of claim 53 wherein said first and second variable capacitors are substantially identical.

55. The process of claim 52 wherein said first and second variable capacitors are substantially identical.

56. The process of claim 51 wherein said first and second variable capacitors are substantially identical.

57. The process of claim 40 wherein said tunable variable reactance includes a first inductor having a first movable core, and a second inductor having a second movable core mechanically linked to said first core.

58. The process of claim 40 wherein said tunable variable reactance includes a substantially continuously variable capacitor.

59. The process of claim 40 wherein said tunable variable reactance includes a variable capacitor and a tunable inductor.

60. A semiconductor fabrication process comprising:
energizing a coil positioned to couple energy into a plasma generation area to maintain a plasma in said plasma generation area; and changing the inductance of a first inductor coupled to said coil so as to shift voltage distributions in a predetermined continuous path along said coil.

61. The process of claim 60 wherein said first inductance changing comprises translating a core within said first inductor.

62. The process of claim 60 further comprising changing the inductance of a second inductor coupled to said coil.

63. The process of claim 62 wherein said second inductance changing occurs simultaneously with said first inductance changing.

64. The process of claim 62 wherein said first and second inductance changings are complementary.

65. The process of claim 64 wherein the sum of said first and second inductances remains substantially constant.

66. The process of claim 62 wherein said first inductance changing comprises translating a first core within said first inductor and said second inductance changing comprises translating a second core within said second inductor and linked to said first core.

67. A semiconductor fabrication process, comprising:
energizing a coil positioned to couple energy into a plasma generation area to maintain a plasma in said plasma generation area, said coil having a plurality of voltage values distributed along said coil; and;
shifting said distribution of voltage values in a predetermined continuous path along said coil.

68. The process of claim 67 wherein said shifting cyclicly shifts said voltage distribution along said coil.

69. The process of claim 67 wherein said shifting uses a first continuously variable inductor coupled between said coil and ground.

70. The process of claim 69 wherein said shifting further uses an RF generator and a second continuously variable inductor coupled between said generator and said coil.

71. The process of claim 70 wherein said shifting includes moving a first movable core of said first inductor and moving a second movable core of said second inductor.

72. The process of claim 71 wherein said first movable core is mechanically linked to said second movable core so that movement of said second movable core is responsive to movement of said first movable core.

73. The process of claim 72 wherein said shifting further comprises using a motor to cyclicly move said first and second movable cores back and forth in unison.

74. The process of claim 71 wherein said first movable core is mechanically linked to said second movable core so that the sum of the inductances of said first and second inductors remains substantially constant during movement of said first and second movable cores.

75. The process of claim 67 wherein said coil is carried by a semiconductor fabrication chamber having said plasma generation area within said chamber.

76. The system of claim 75 wherein said coil is positioned within said chamber.

77. A semiconductor fabrication system, comprising:
a semiconductor fabrication chamber having a plasma generation area within said chamber;
a coil positioned to couple energy into said plasma generation area to maintain a plasma in said plasma generation area, said coil having a plurality of voltage values distributed along said coil; and
a voltage distribution controller adapted to shift said distribution of voltage values in a predetermined continuous path along said coil.

78. The system of claim 77 wherein said controller is adapted to cyclicly shift said voltage value distribution along said coil.

79. The system of claim 77 wherein said controller comprises a first continuously variable inductor coupled between said coil and ground.

80. The system of claim 79 wherein said controller comprises an RF generator and a second continuously variable inductor coupled between said generator and said coil.

81. The system of claim 80 wherein said first inductor has a first movable core and said second inductor has a second movable core.

82. The system of claim 81 wherein said first movable core is mechanically linked to said second movable core so that movement of said second movable core is responsive to movement of said first movable core.

83. The system of claim 82 wherein said controller further comprises a motor for cyclicly moving said first and second movable cores back and forth in unison.

84. The system of claim 81 wherein said first movable core is mechanically linked to said second movable core so that the sum of the inductances of said first and second inductors remains substantially constant during movement of said first and second movable cores.

85. A semiconductor fabrication system, comprising:
a semiconductor fabrication chamber having a plasma generation area within said chamber;
a coil positioned to couple energy into said plasma generation area to maintain a plasma in said plasma generation area, said coil having a plurality of voltage values distributed along said coil;
a first inductor coupled between said coil and ground; and
an inductance controller adapted to change the inductance of said first inductor so as to shift said voltage value distribution in a predetermined continuous path along said coil.

86. The system of claim 85 wherein said first inductor has a first movable core and said inductance controller comprises an actuator adapted to move said first core within said first inductor.

87. The system of claim 86 further comprising an RF generator coupled to said coil and a second inductor coupled between said generator and said coil.

88. The system of claim 87 wherein said second inductor has a second movable core and said inductance controller comprises an actuator adapted to move said second core within said second inductor.

89. The system of claim 88 wherein inductance controller actuators are adapted to move said first core within said first inductor simultaneously with moving said second core within said second inductor.

90. The system of claim 89 wherein said inductance controller actuators are adapted to move said first core within said first inductor and to move said second core within said second inductor so that the inductances of said first and second inductances are changed complementary one to the other.

91. The system of claim 88 wherein said inductance controller actuators are adapted to move said first core within said first inductor and to move said second core within said second inductor so that the sum of the inductances of said first and second inductors remains substantially constant.

92. The system of claim 88 wherein said inductance controller actuators are mechanically linked so that said first and second cores move in unison.

* * * * *